(12) United States Patent
Dong et al.

(10) Patent No.: US 11,437,265 B2
(45) Date of Patent: Sep. 6, 2022

(54) MASS TRANSFER METHOD AND SYSTEM FOR MICRO LIGHT EMITTING DIODES

(71) Applicant: BOE Technology Group Co., Ltd., Beijing (CN)

(72) Inventors: Xue Dong, Beijing (CN); Guangcai Yuan, Beijing (CN); Zhijun Lv, Beijing (CN); Haixu Li, Beijing (CN); Zhiwei Liang, Beijing (CN); Huijuan Wang, Beijing (CN); Ke Wang, Beijing (CN); Zhanfeng Cao, Beijing (CN); Hsuanwei Mai, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 110 days.

(21) Appl. No.: 16/770,655

(22) PCT Filed: Jun. 13, 2019

(86) PCT No.: PCT/CN2019/091167
§ 371 (c)(1),
(2) Date: Jun. 8, 2020

(87) PCT Pub. No.: WO2020/248201
PCT Pub. Date: Dec. 17, 2020

(65) Prior Publication Data
US 2021/0407841 A1    Dec. 30, 2021

(51) Int. Cl.
*H01L 21/683* (2006.01)
*H01L 25/075* (2006.01)
*H01L 33/62* (2010.01)

(52) U.S. Cl.
CPC ...... *H01L 21/6835* (2013.01); *H01L 25/0753* (2013.01); *H01L 33/62* (2013.01);
(Continued)

(58) Field of Classification Search
CPC . H01L 21/6835; H01L 25/0753; H01L 33/62; H01L 2221/68354;
(Continued)

(56) References Cited

U.S. PATENT DOCUMENTS

| | | | | |
|---|---|---|---|---|
| 6,942,750 B2 * | 9/2005 | Chou | ..................... | B81B 7/0051 156/272.2 |
| 10,984,708 B1 * | 4/2021 | Pourchet | ................. | H01L 33/62 |

(Continued)

FOREIGN PATENT DOCUMENTS

| CN | 101859714 A | 10/2010 |
|---|---|---|
| CN | 106783648 A | 5/2017 |

(Continued)

OTHER PUBLICATIONS

Office Action for corresponding Indian application No. 202027053829 dated Feb. 10, 2022.

*Primary Examiner* — Vu A Vu
(74) *Attorney, Agent, or Firm* — ArentFox Schiff LLP; Michael Fainberg

(57) ABSTRACT

The present disclosure discloses a mass transfer method and system for micro light emitting diodes, wherein the mass transfer method includes: providing a component substrate on which a plurality of micro light emitting diodes are formed; picking up the micro light emitting diodes on the component substrate at least once by a plurality of bonding structures on a first medium load substrate, and transferring micro light emitting diodes picked up every time to a second medium load substrate; and transferring the micro light emitting diodes on the second medium load substrate into corresponding sub-pixels on a target substrate at one time, wherein one of the micro light emitting diodes on the second medium load substrate corresponds to one of the sub-pixels on the target substrate.

17 Claims, 24 Drawing Sheets

(52) U.S. Cl.
CPC ............... *H01L 2221/68354* (2013.01); *H01L 2221/68368* (2013.01); *H01L 2221/68381* (2013.01); *H01L 2933/0066* (2013.01)

(58) Field of Classification Search
CPC . H01L 2221/68368; H01L 2221/68381; H01L 2933/0066
USPC .......................................................... 438/28
See application file for complete search history.

(56) References Cited

U.S. PATENT DOCUMENTS

| | | |
|---|---|---|
| 2010/0259164 A1 | 10/2010 | Oohata et al. |
| 2018/0166429 A1 | 6/2018 | Chong et al. |
| 2018/0374829 A1 | 12/2018 | Henley |
| 2019/0181122 A1* | 6/2019 | Hsu ........................ H01L 33/62 |
| 2019/0393066 A1 | 12/2019 | Hong |

FOREIGN PATENT DOCUMENTS

| | | | |
|---|---|---|---|
| CN | 108962789 A | 12/2018 | |
| CN | 109524512 A | 3/2019 | |
| WO | 2018170352 A1 | 9/2018 | |
| WO | 2019005818 A1 | 1/2019 | |

* cited by examiner

MASS TRANSFER METHOD AND SYSTEM FOR MICRO LIGHT EMITTING DIODES The present disclosure is a national stage application of International Application No. PCT/CN2019/091167, filed Jun. 13, 2019, which is hereby incorporated by reference in its entirety.

FIELD

The present disclosure relates to the technical field of mass transfer and in particular to a mass transfer method and system for micro light emitting diodes.

BACKGROUND

A Micro Light Emitting Diode (micro LED) realizes display by miniaturizing and matrixing a traditional LED structure. The micro LED has become the research focus in the display field due to the advantages such as small size, high resolution ratio, high brightness, high light emitting efficiency and low power consumption.

SUMMARY

A mass transfer method for micro light emitting diodes, provided by an embodiment of the present disclosure, includes:
providing a component substrate on which a plurality of micro light emitting diodes are formed;
picking up the micro light emitting diodes on the component substrate at least once by a plurality of bonding structures on a first medium load substrate, and transferring micro light emitting diodes picked up every time to a second medium load substrate; where one of the micro light emitting diodes on the second medium load substrate corresponds to one of sub-pixel on a target substrate; and transferring the micro light emitting diodes on the second medium load substrate into corresponding sub-pixels on the target substrate at one time.

Optionally, in the embodiment of the present disclosure, one of the bonding structures corresponds to one of the sub-pixels on the target substrate;
where the plurality of bonding structures of the first medium load substrate are formed by following steps:
cutting a first medium load substrate motherboard to obtain the first medium load substrates;
forming a bonding material layer on the first medium load substrate; and
patterning the bonding material layer by adopting a one-time patterning process to form the plurality of bonding structures arranged in an array.

Optionally, in the embodiment of the present disclosure, one of the bonding structures corresponds to one of the sub-pixels on the target substrate;
where the plurality of bonding structures of the first medium load substrate are formed by following steps:
forming a bonding material layer on a first medium load substrate motherboard;
patterning the bonding material layer by adopting a one-time patterning process to form the plurality of bonding structures arranged in an array; and
cutting the first medium load substrate motherboard on which the bonding structures are formed to obtain the first medium load substrate on which the plurality of bonding structures arranged in an array are formed.

Optionally, in the embodiment of the present disclosure, quantity of the micro light emitting diodes borne on the second medium load substrate is greater than quantity of the micro light emitting diodes borne on the first medium load substrate.

Optionally, in the embodiment of the present disclosure, the plurality of micro light emitting diodes include micro light emitting diodes with at least one color; one first medium load substrate is provided;
the picking up the micro light emitting diodes on the component substrate at least once by the plurality of bonding structures on the first medium load substrate, and transferring micro light emitting diodes picked up every time to the second medium load substrate includes:
successively for micro light emitting diodes with each color of the plurality of micro light emitting diodes, picking up the micro light emitting diodes with the each color on the component substrate for many times by the first medium load substrate, and transferring the micro light emitting diodes with the each color picked up every time to micro light emitting diode regions, corresponding to the each color, on the second medium load substrate.

Optionally, in the embodiment of the present disclosure, the plurality of micro light emitting diodes includes micro light emitting diodes with at least one color; one color corresponds to one of the first medium load substrates;
the picking up the micro light emitting diodes on the component substrate at least once by the plurality of bonding structures on the first medium load substrate, and transferring micro light emitting diodes picked up every time to the second medium load substrate includes:
for micro light emitting diodes with each color of the plurality of micro light emitting diodes, picking up the micro light emitting diodes with the each color on the component substrate by the first medium load substrate corresponding to the each color, and transferring the micro light emitting diodes with the each color picked up every time into micro light emitting diode regions, corresponding to the each color, on the second medium load substrate.

Optionally, in the embodiment of the present disclosure, the picking up the micro light emitting diodes with the each color on the component substrate includes:
aligning the first medium load substrate with the component substrate;
bonding the bonding structures on the aligned first medium load substrate with to-be-picked-up micro light emitting diodes with the each color on the component substrate one to one; and
separating the component substrate from the to-be-picked-up micro light emitting diodes with the each color by adopting a laser or heating drying process so that the to-be-picked-up micro light emitting diodes with the each color bonded with the first medium load substrate are picked up.

Optionally, in the embodiment of the present disclosure, the second medium load substrate includes a bonding film layer covering the second medium load substrate; and
the transferring the micro light emitting diodes with the each color picked up every time into the micro light emitting diode regions, corresponding to the each color, on the second medium load substrate includes:
aligning the first medium load substrate with the second medium load substrate;
bonding the micro light emitting diodes with the each color on the aligned first medium load substrate with the micro light emitting diode regions, corresponding to the each color, on the second medium load substrate one to one; and separating the first medium load substrate from the micro light emitting diodes with the each color on the first medium load substrate so that the micro light emitting diodes with the each color on the first medium load substrate are transferred into the micro light emitting diode regions, corresponding to the each color, on the second medium load substrate.

Optionally, in the embodiment of the present disclosure, the material of the bonding structures includes a pyrolytic adhesive; and the separating the first medium load substrate from the micro light emitting diodes with the each color on the first medium load substrate includes:

separating the first medium load substrate from the micro light emitting diodes with the each color on the first medium load substrate by adopting a hot pressing process.

Optionally, in the embodiment of the present disclosure, the material of the bonding structures includes a photolytic adhesive; and the separating the first medium load substrate from the micro light emitting diodes with the each color on the first medium load substrate includes:

separating the first medium load substrate from the micro light emitting diodes with the each color on the first medium load substrate by virtue of laser.

Optionally, in the embodiment of the present disclosure, the size of the second medium load substrate is greater than or equal to that of the target substrate; and the transferring the micro light emitting diodes on the second medium load substrate into the corresponding sub-pixels on the target substrate at one time includes:

aligning the second medium load substrate with the target substrate; and separating the second medium load substrate from the micro light emitting diodes so that the micro light emitting diodes on the second medium load substrate are transferred into the corresponding sub-pixels on the target substrate at one time.

Optionally, in the embodiment of the present disclosure, the target substrate includes at least two target regions with a same size; the size of one of the second medium load substrates is substantially the same as that of one of the target regions; and the transferring the micro light emitting diodes on the second medium load substrate into the corresponding sub-pixels on the target substrate at one time includes:

aligning the second medium load substrate with the target regions sequentially, and separating the second medium load substrate from the micro light emitting diodes after each alignment so that the micro light emitting diodes on the second medium load substrate are transferred into the corresponding sub-pixels on the target substrate at one time.

Optionally, in the embodiment of the present disclosure, the material of the bonding film layer on the second medium load substrate includes a pyrolytic adhesive; and the separating the second medium load substrate from the micro light emitting diodes includes:

separating the second medium load substrate from the micro light emitting diodes on the second medium load substrate by adopting a hot pressing process.

Optionally, in the embodiment of the present disclosure, the material of the bonding film layer on the second medium load substrate includes a photolytic adhesive; and the separating the second medium load substrate from the micro light emitting diodes includes:

separating the second medium load substrate from the micro light emitting diodes on the second medium load substrate by virtue of laser.

Optionally, in the embodiment of the present disclosure, the target substrate includes a plurality of sub-pixels, each of the sub-pixels includes a first electrode, a second electrode, and anisotropic conductive adhesives respectively located on sides of the first electrode and the second electrode facing away from the target substrate, where the first electrode and the second electrode are formed in advance;

while or after separating the second medium load substrate from the micro light emitting diodes on the second medium load substrate, the mass transfer method further includes:

connecting electrodes of the micro light emitting diodes separated from the second medium load substrate electrically to the anisotropic conductive adhesives in the corresponding sub-pixels.

An embodiment of the present disclosure further provides a mass transfer system for micro light emitting diodes, including:

a first medium load substrates, at least one of which is provided with a plurality of bonding structures, and a second medium load substrate;

where the first medium load substrate is configured to pick up micro light emitting diodes on a component substrate at least once by virtue of the plurality of bonding structures and transfer the micro light emitting diodes picked up every time to the second medium load substrate; and where the second medium load substrate is configured to transfer the micro light emitting diodes on the second medium load substrate into corresponding sub-pixels on a target substrate at one time, and one of the micro light emitting diodes on the second medium load substrate corresponds to one of the sub-pixels on the target substrate.

Optionally, in the embodiment of the present disclosure, quantity of the micro light emitting diodes borne on the second medium load substrate is greater than quantity of the micro light emitting diodes borne on the first medium load substrate.

Optionally, in the embodiment of the present disclosure, the size of the second medium load substrate is greater than or equal to that of the target substrate.

Optionally, in the embodiment of the present disclosure, the target substrate includes at least two target regions with a same size; and a size of one of the second medium load substrates is substantially same as that of one of the target regions.

DETAILED DESCRIPTION OF THE EMBODIMENTS

Figure 1:
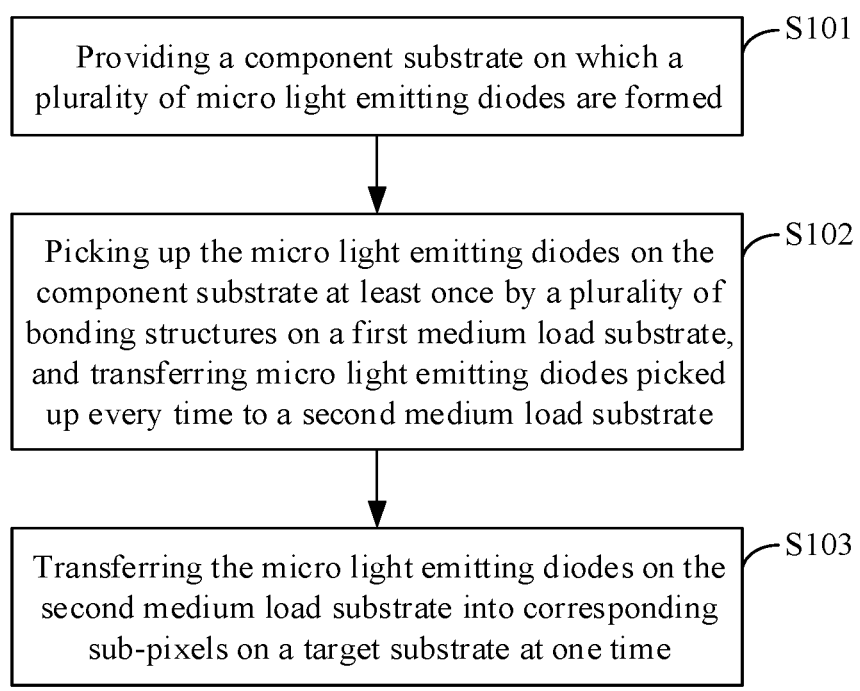
FIG. 1 is a flowchart of a mass transfer method provided by an embodiment of the present disclosure.

In order to make objectives, technical solutions and advantages of the embodiments of the present disclosure clearer, the technical solutions in the embodiment of the present disclosure will be described clearly and completely below in conjunction with accompanying drawings in the embodiment of the present disclosure. Obviously, the described embodiments are a part of the embodiments of the present disclosure, not all the embodiments. Furthermore, the embodiments in the present disclosure and features in the embodiments may be combined with each other without conflicts. Based on the described embodiments of the present disclosure, all other embodiments obtained by those ordinarily skilled in the art without creative work shall fall within the protection scope of the present disclosure.

Unless otherwise defined, technical terms or scientific terms used in the present disclosure shall be ordinary meanings as understood by those ordinarily skilled in the art of the present disclosure. The words "first", "second" and similar terms used in the present disclosure do not denote any order, quantity or importance, but are merely used to distinguish different components. The word "including" or "containing" or the like means that the element or item preceding the word covers the element or object listed after the word and its equivalent, without excluding other elements or objects. The words "connection" or "junction" and the like are not limited to physical or mechanical connections, but may include electrical connections, whether direct or indirect.

It should be noted that the sizes and shapes of all patterns in the accompanying drawings do not reflect real scales, and are merely to illustrate the contents of the present disclosure. Furthermore, same or similar numerals throughout indicate same or similar elements or elements with same or similar functions.

A preparation process of micro light emitting diodes is that: firstly, light emitting diode structures are thinned, miniaturized and arrayed to achieve the sizes from about 1 to 100 micrometers, then, the micro light emitting diodes are transferred to a circuit substrate in batches, and finally, the micro light emitting diodes transferred are packaged. How to realize batch transfer is a key difficulty in the process, and thus, a mass transfer technology appears at the right moment. The mass transfer technology is a technology for loading micro light emitting diodes formed on a component substrate onto the circuit substrate, each of the micro light emitting diodes corresponds to one sub-pixel on the circuit substrate. Since the sizes of the micro light emitting diodes are small and millions of sub-pixels are required on the circuit substrate, how to selectively transfer the produced micro light emitting diodes to the circuit substrate in batches at high efficiency and low cost is a technical problem urgent to be solved at present by those skilled in the art.

Based on this, embodiments of the present disclosure provide some mass transfer methods for micro light emitting diodes to increase the transfer efficiency.

The mass transfer methods for the micro light emitting diodes, provided by the embodiments of the present disclosure, as shown in FIG. 1, may include the following steps:

S101, providing a component substrate on which a plurality of micro light emitting diodes are formed;

S102, picking up the micro light emitting diodes on the component substrate at least once by a plurality of bonding structures on a first medium load substrate, and transferring the micro light emitting diodes picked up every time to a second medium load substrate; and S103, transferring the micro light emitting diodes on the second medium load substrate into corresponding sub-pixels on a target substrate at one time, wherein one of the micro light emitting diodes on the second medium load substrate corresponds to one of the sub-pixels on the target substrate.

According to the mass transfer method for the micro light emitting diodes, provided by the embodiment of the present disclosure, the plurality of bonding structures are arranged on the first medium load substrate, the micro light emitting diodes on the component substrate are picked up by these bonding structures independent from each other and are transferred to the second medium load substrate after being picked up, in this way, the micro light emitting diodes on the component substrate can be selectively transferred to the second medium load substrate, so that the efficiency is increased. Moreover, the bonding structures may also be repeatedly utilized, and the micro light emitting diodes are picked up at least once by the bonding structures on the first medium load substrate, so that the micro light emitting diodes on the component substrate are transferred to the second medium load substrate by repeatedly utilizing the bonding structures, and furthermore, the number of the used first medium load substrates and the cost can be reduced. In addition, the micro light emitting diodes on the second medium load substrate are transferred into the corresponding sub-pixels on the target substrate at one time without additional multi-time transfer, so that the efficiency can be increased.

Figure 2A:
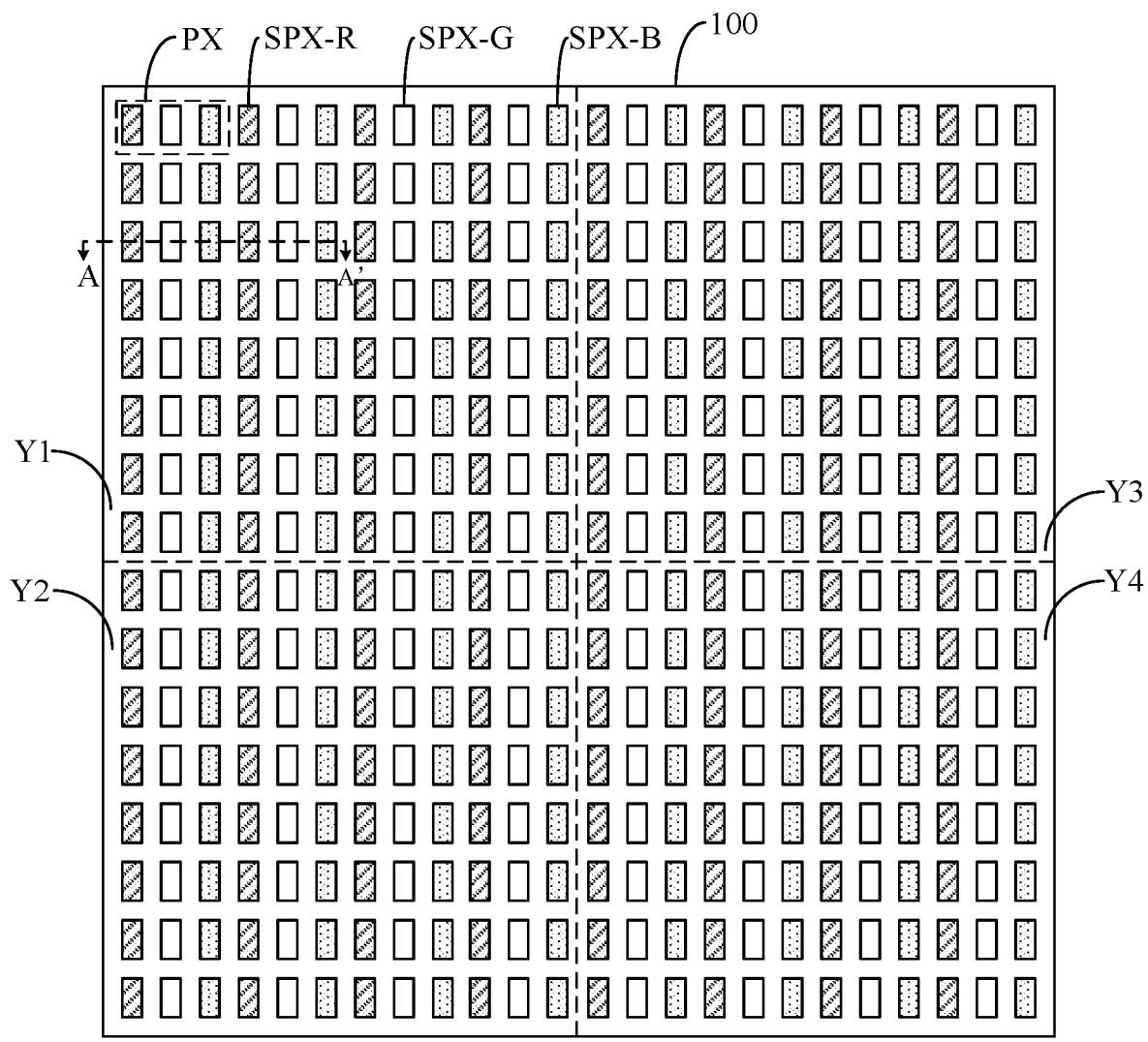
FIG. 2a is a schematic diagram of a top-view structure of a target substrate provided by the embodiment of the present disclosure.
Figure 2B:
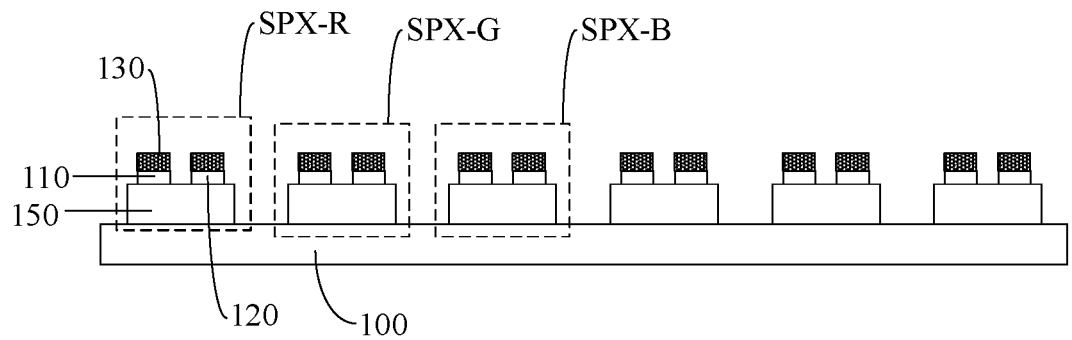
FIG. 2b is a schematic diagram of a sectional structure of the target substrate as shown in FIG. 2a in an AA' direction.

Generally, the target substrate is applied to the formation of a display panel so as to ensure that the display panel achieves a display function. During specific implementation, as shown in FIG. 2a and FIG. 2b, the target substrate 100 may include a plurality of pixel units PX arranged in an array, and each of the pixel units includes a plurality of sub-pixels. Moreover, the sub-pixels in the target substrate 100 are arranged in an array. Exemplarily, as shown in FIG. 2a and FIG. 2b, the pixel units PX may include red sub-pixels SPX-R, green sub-pixels SPX-G and blue sub-pixels SPX-B, and thus, color display can be realized by mixing red, green and blue colors after the target substrate 100 is applied to the display panel. Or, the pixel units may also include red sub-pixels, green sub-pixels, blue-sub-pixels and white sub-pixels, in this way, color display can be realized by mixing red, green, blue and white colors after the target substrate is applied to the display panel. Of course, during actual application, the colors of the sub-pixels in the pixel units may be designed and determined according to an actual application environment, but are not limited herein.

Generally, a driving circuit is formed on a substrate by adopting a Thin Film Transistor (TFT) preparation process to form the circuit substrate. In this way, the micro light emitting diodes may be driven by the driving circuit to emit light after being transferred into the sub-pixels of the circuit substrate. During specific implementation, in the embodiment of the present disclosure, the target substrate may be the circuit substrate. As shown in FIG. 2*b*, each of the sub-pixels may include a driving circuit 150 formed in advance as well as a first electrode 110 and a second electrode 120 electrically connected to the driving circuit 150. The anodes of the micro light emitting diodes may be electrically connected with the first electrode 110, and the cathodes of the micro light emitting diodes may be electrically connected with the second electrode 120, so that the driving circuit 150 inputs a voltage or current to the micro light emitting diodes electrically connected with the first electrode 110 and the second electrode 120 through the first electrode 110 and the second electrode 120 so as to drive the micro light emitting diodes to emit light.

Exemplarily, the substrate may include a glass substrate. Of course, during actual application, the substrate may also be made of other types of materials, which needs to be designed and determined according to an actual application environment, but is not limited herein.

Figure 3A:
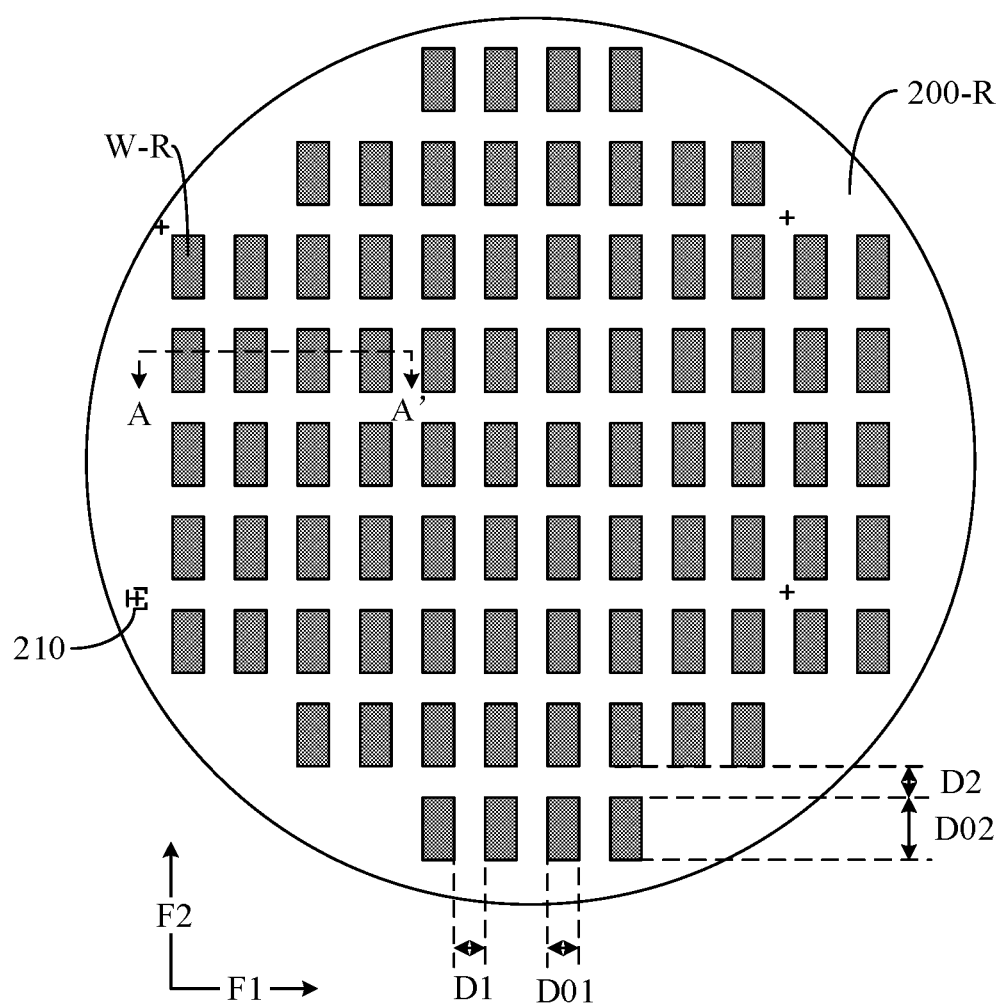
FIG. 3a is a schematic diagram of a top-view structure of some component substrates provided by embodiments of the present disclosure.
Figure 3B:
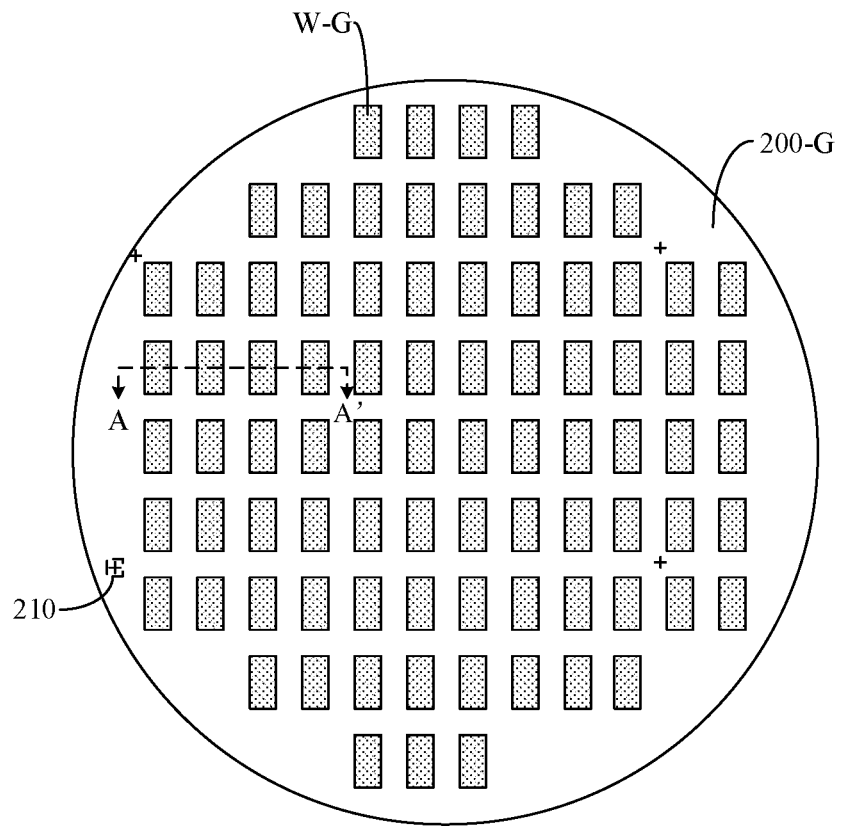
FIG. 3b is a schematic diagram of a top-view structure of some another component substrates provided by embodiments of the present disclosure.
Figure 3C:
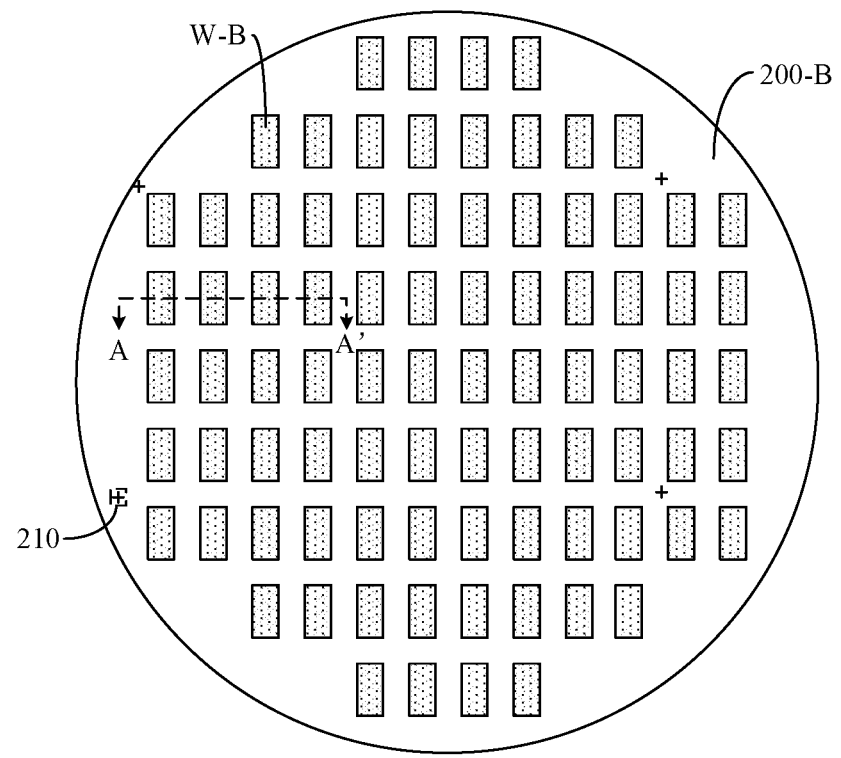
FIG. 3c is a schematic diagram of a top-view structure of some further component substrates provided by embodiments of the present disclosure.
Figure 3D:
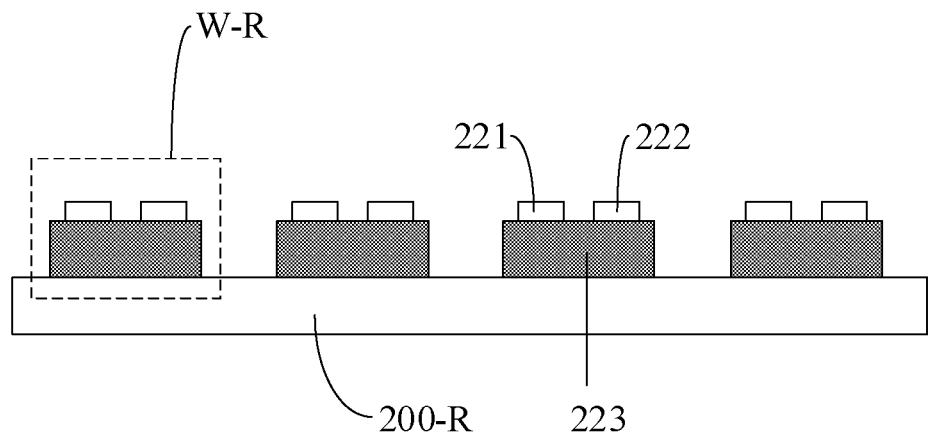
FIG. 3d is a schematic diagram of a sectional structure of the component substrates as shown in FIG. 3a in the AA' direction.
Figure 3E:
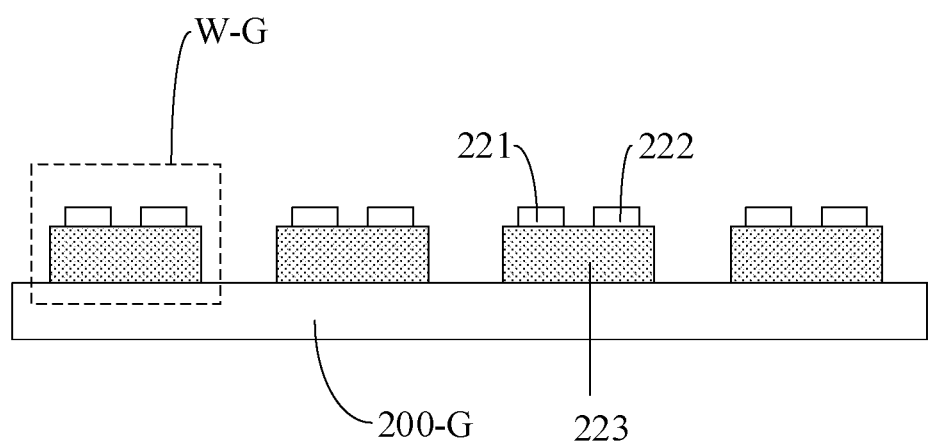
FIG. 3e is a schematic diagram of a sectional structure of the component substrates as shown in FIG. 3b in the AA' direction.
Figure 3F:
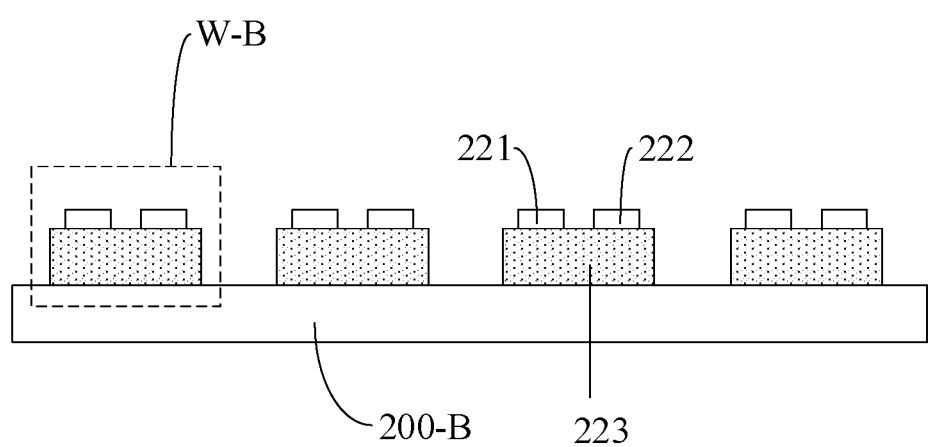
FIG. 3f is a schematic diagram of a sectional structure of the component substrates as shown in FIG. 3c in the AA' direction.

During specific implementation, in the embodiment of the present disclosure, the plurality of micro light emitting diodes formed on the component substrate may be arranged in the array, and one of the micro light emitting diodes in the component substrate corresponds to one of the sub-pixels on the target substrate. Exemplarily, as shown in FIG. 3*d* to FIG. 3*f*, each of the micro light emitting diodes may be provided with an anode 221, a cathode 222 and a light emitting chip main body 223. Exemplarily, the size of the component substrate may be smaller than that of the target substrate. Moreover, micro light emitting diodes with the same color may be formed on the component substrate. As shown in FIG. 3*a* and FIG. 3*d*, a plurality of red micro light emitting diodes W-R arranged in an array may be formed on a component substrate 200-R, so that the red micro light emitting diodes W-R on the component substrate 200-R are arranged in one-to-one correspondence to red sub-pixels SPX-R in a certain region of the target substrate 100. As shown in FIG. 3*b* to FIG. 3*e*, a plurality of green micro light emitting diodes W-G arranged in an array may be formed on a component substrate 200-G, so that the green micro light emitting diodes W-G on the component substrate 200-G are arranged in one-to-one correspondence to green sub-pixels SPX-G in a certain region of the target substrate 100. As shown in FIG. 3*c* to FIG. 3*f*, a plurality of blue micro light emitting diodes W-B arranged in an array may be formed on a component substrate 200-B, so that the blue micro light emitting diodes W-B on the component substrate 200-B are arranged in one-to-one correspondence to blue sub-pixels SPX-B in a certain region of the target substrate 100. Or, a plurality of micro light emitting diodes with different colors arranged in an array may also be formed on the component substrate, and the limitations thereof are omitted herein.

Further, during specific implementation, in the embodiment of the present disclosure, the component substrate may be one of a wafer, a blue membrane and a sapphire substrate. Exemplarily, as shown in FIG. 3*a* to FIG. 3*c*, the wafer is generally round, and the micro light emitting diodes are arranged in an array on the wafer. Of course, during actual application, the component substrate may also be made of other types of materials, which needs to be designed and determined according to an actual application environment, but is not limited herein.

Figure 4:
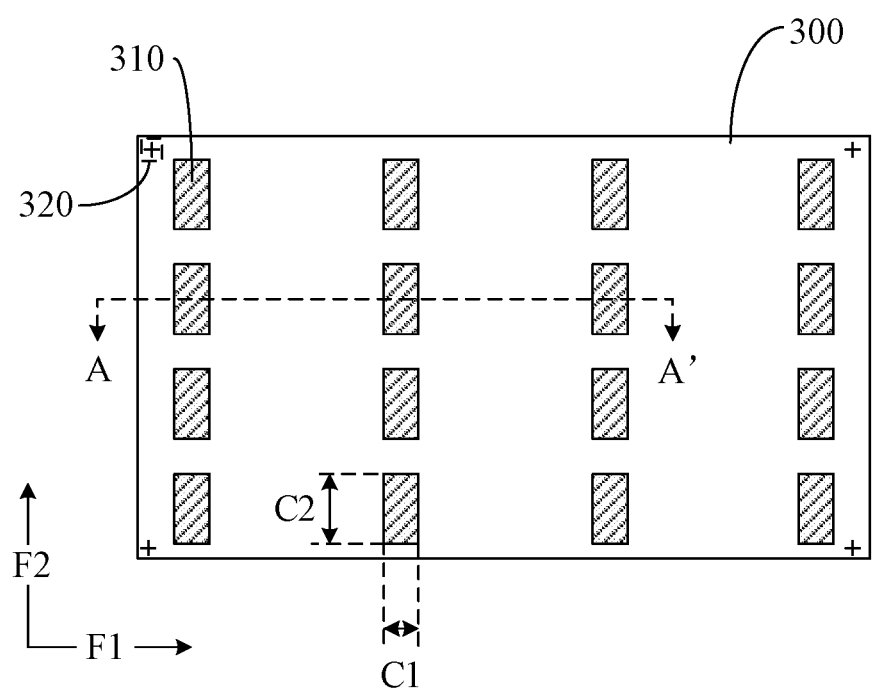
FIG. 4 is a schematic diagram of a top-view structure of some first medium load substrates provided by embodiments of the present disclosure.

During specific implementation, as shown in FIG. 3*a* to FIG. 4, a first medium load substrate 300 may be rectangular such as oblong or square. Further, the size of the first medium load substrate 300 may be smaller than that of a component substrate 200 and may be 6 inch, 8 inch or 12 inch, for example. Or the size of the first medium load substrate 300 may also be greater than that of the component substrate 200. In the embodiment of the present disclosure, as shown in FIG. 4, a plurality of bonding structures 310 arranged in an array may be formed on the first medium load substrate 300. Moreover, one of the bonding structures 310 corresponds to one of the sub-pixels on the target substrate 100. Exemplarily, the step of forming a plurality of bonding structures on a first medium load substrate may include the following steps:

cutting a first medium load substrate motherboard to obtain the first medium load substrates;

forming a bonding material layer on each first medium load substrate; and patterning the bonding material layer by adopting a one-time patterning process to form the plurality of bonding structures arranged in an array.

The size of the first medium load substrate motherboard may be the same as the size of the second medium load substrate, such that, the size of the second medium load substrate is an integer multiple of the size of each first medium load after the first medium load substrate motherboard is cut.

In this way, the patterned bonding structures 310 can be formed by the one-time patterning process, the preparation process can be simplified, the production cost can be reduced, and the production efficiency can be increased.

Or, a first medium load substrate motherboard is patterned firstly and is then cut to form the first medium load substrate, so that it can be further ensured that the thickness and spacing of the bonding structures on the first medium load substrate are more uniform. During specific implementation, the step of forming the bonding structures on a first medium load substrate may also include the following steps:

forming a bonding material layer on a first medium load substrate motherboard;

patterning the bonding material layer by adopting a one-time patterning process to form the plurality of bonding structures arranged in an array; and cutting the first medium load substrate motherboard on which the bonding structures are formed to obtain the first medium load substrate on which the plurality of bonding structures arranged in the array are formed.

The size of the first medium load substrate motherboard on which the bonding structures are formed may be the same as the size of the second medium load substrate, such that, the size of the second medium load substrate is an integer multiple of the size of each first medium load on which the plurality of bonding structures arranged in the array are formed, after the first medium load substrate motherboard on which the bonding structures are formed is cut.

In this way, the patterned bonding structures 310 can be formed by the one-time patterning process, the preparation process can be simplified, the production cost can be reduced, and the production efficiency can be increased.

Exemplarily, during specific implementation, in the embodiment of the present disclosure, the patterning process may include a photolithographic process and an etching step, wherein the photolithographic process refers to a forming patterns process by virtue of a photoresist, a mask plate, exposure machine and the like, during the technical processes such as exposure and development. During specific implementation, the corresponding patterning process may be selected according to the formed structure in the present disclosure. Of course, other processes may also be adopted, for example, the bonding structures are formed by adopting a printing process and the like, and the limitations thereof are limited herein.

During specific implementation, as shown in FIG. 4, the size of one of the bonding structures 310 may be not greater than that of one of the micro light emitting diodes. Exemplarily, the size of one of the bonding structures 310 may be equal to that of one of the micro light emitting diodes. For example, orthographic projections of the bonding structures 310 on the first medium load substrate 300 are overlapped with orthographic projections of the micro light emitting diodes on the first medium load substrate 300.

Or, during specific implementation, the size of one of the bonding structures 310 may also be greater than the size of one of the micro light emitting diodes, moreover, as shown in FIG. 4 and FIG. 3a, the width of one bonding structure 310 may be smaller than the sum of the width of one micro light emitting diode and a gap among components in at least one direction of a first direction F1 and a second direction F2. Exemplarily, the width C1 of one bonding structure 310 is smaller than the sum of the width D01 of one micro light emitting diode and a gap D1 between two adjacent micro light emitting diodes in the first direction F1, namely C1<D01+D1. The width C2 of one bonding structure 310 is smaller than the sum of the width D02 of one micro light emitting diode and a gap D2 between two adjacent micro light emitting diodes in the second direction F2, namely C2<D02+D2.

During specific implementation, as shown in FIG. 4, the bonding structures 310 may be oblong, square and the like. Of course, during actual application, the bonding structures 310 may also be in other shapes, the limitations thereof are omitted herein.

Figure 5:
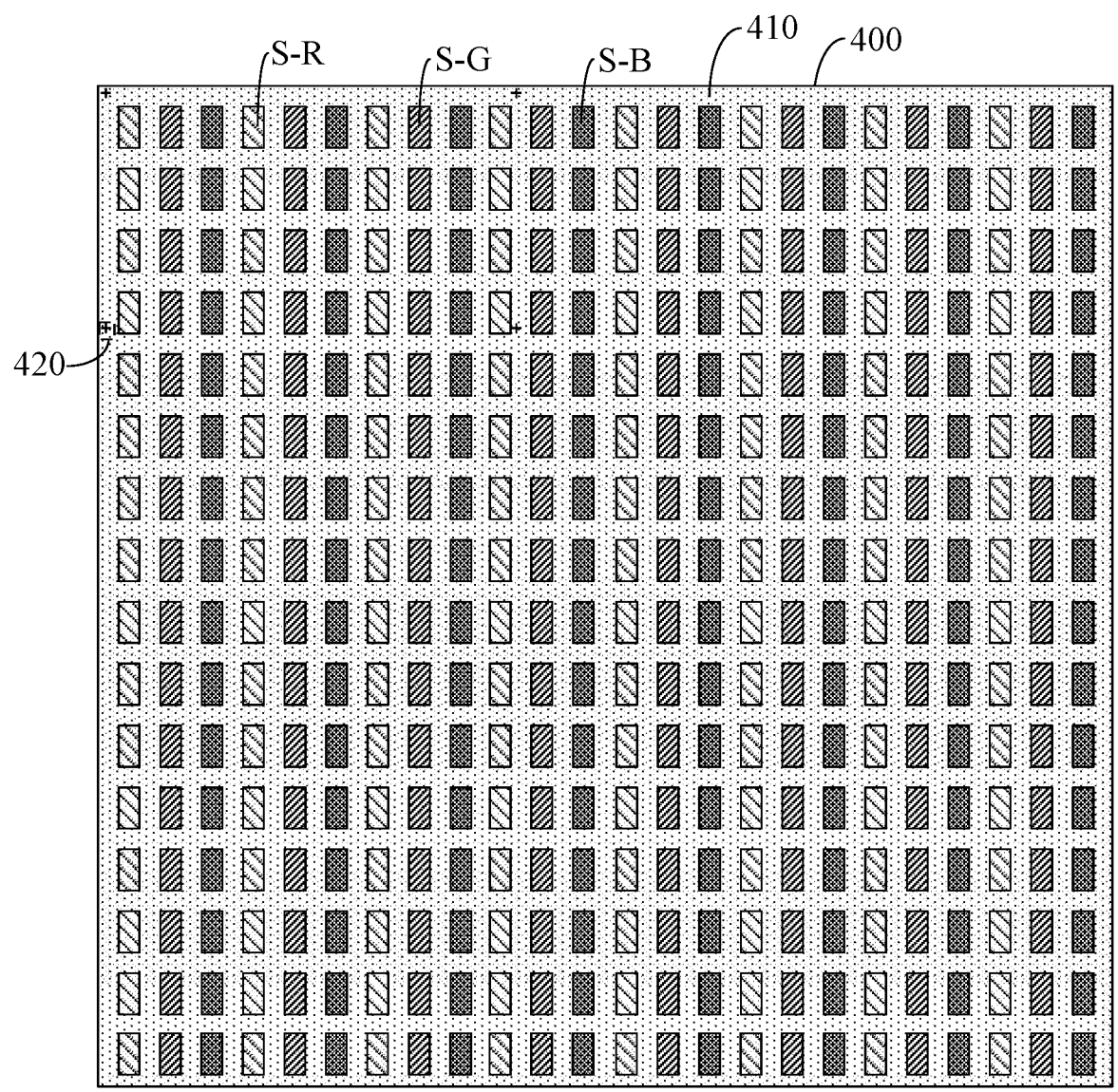
FIG. 5 is a schematic diagram of a top-view structure of some second medium load substrates provided by embodiments of the present disclosure.

During specific implementation, as shown in FIG. 5, a second medium load substrate 400 may also include a bonding film layer 410 covering the second medium load substrate. The bonding film layer 410 is provided with micro light emitting diode regions corresponding to different colors. Moreover, one of the micro light emitting diode regions corresponds to one of the sub-pixels on the target substrate 100. Exemplarily, the bonding film layer 410 is provided with micro light emitting diode regions S-R corresponding to red, micro light emitting diode regions S-G corresponding to green and micro light emitting diode regions S-B corresponding to blue, wherein the micro light emitting diode regions S-R correspond to the red sub-pixels SPX-R on the target substrate 100, the micro light emitting diode regions S-G correspond to the green sub-pixels SPX-G on the target substrate 100, and the micro light emitting diode regions S-B correspond to the blue sub-pixels SPX-B on the target substrate 100.

During specific implementation, in the embodiment of the present disclosure, the number of the micro light emitting diodes borne on the second medium load substrate may be greater than the number of the micro light emitting diodes borne on the first medium load substrate. In this way, the frequency of transferring the micro light emitting diodes from the second medium load substrate to the target substrate can be reduced, and the efficiency can be further increased. Exemplarily, as shown in FIG. 4 and FIG. 5, the size of the second medium load substrate may be greater than that of the first medium load substrate, so that the number of the micro light emitting diodes which can be borne on the second medium load substrate is greater than the number of the micro light emitting diodes borne on the first medium load substrate. Of course, during actual application, the size of the second medium load substrate may be an integral multiple as great as the first medium load substrate, such as one time and two times which is required to be designed and determined according to an actual application environment, but is not limited herein.

Exemplarily, the first medium load substrate may include a glass substrate. Of course, during actual application, the first medium load substrate may also be made of other types of materials which are not limited herein.

Exemplarily, the second medium load substrate may also include a glass substrate or a blue membrane. Of course, during actual application, the second medium load substrate may also be made of other types of materials which are not limited herein.

During specific implementation, a plurality of component substrates may be provided, for example, at least one component substrate 200-R provided with red light emitting diodes W-R, at least one component substrate 200-G provided with green light emitting diodes W-G and at least one component substrate 200-B provided with blue light emitting diodes W-B are provided. In this way, the micro light emitting diodes on the target substrate may include various micro light emitting diodes with different colors. Of course, during actual application, the number of the component substrates 200-R, the component substrates 200-G and the component substrates 200-B required to be used may be designed and determined according to an actual application environment, but is not limited herein.

During specific implementation, in the embodiment of the present disclosure, one first medium load substrate may be provided, then, the step of picking up the micro light emitting diodes on the component substrate at least once by a plurality of bonding structures on the first medium load substrate, and transferring micro light emitting diodes picked up every time to the second medium load substrate may include: successively for the micro light emitting diodes with each color, picking up the micro light emitting diodes with the each color on the component substrate for many times by the first medium load substrate, and transferring the micro light emitting diodes with the color picked up every time into the micro light emitting diode regions, corresponding to the color, on the second medium load substrate. Exemplarily, for the red micro light emitting diodes W-R, the red micro light emitting diodes W-R on the component substrate 200-R are picked up by the bonding structures 310 on the first medium load substrate 300 for many times, and the red micro light emitting diodes W-R picked up every time are transferred into the micro light emitting diode regions S-R, corresponding to red, on the second medium load substrate 400, so that the red micro light emitting diodes W-R are arranged in all the micro light emitting diode regions S-R, corresponding to red, on the second medium load substrate 400.

During specific implementation, in the embodiment of the present disclosure, the step of picking up the micro light emitting diodes with the color on the component substrate may include:

aligning the first medium load substrate with the component substrate;

bonding the bonding structures on the aligned first medium load substrate with to-be-picked-up micro light emitting diodes with the color on the component substrate one to one; and separating the component substrate from the to-be-picked-up micro light emitting diodes with the color by adopting laser so that the bonded micro light emitting diodes with the color are picked up by the first medium load substrate. Or, the component substrate is separated from the to-be-picked-up micro light emitting diodes with the color by adopting a heating drying process so that the bonded micro light emitting diodes with the color are picked up by the first medium load substrate.

During specific implementation, in the embodiment of the present disclosure, the step of transferring the micro light emitting diodes with the color picked up every time into the micro light emitting diode regions, corresponding to the color, on the second medium load substrate may include the following steps:

aligning the first medium load substrate with the second medium load substrate;

bonding the micro light emitting diodes with the color on the aligned first medium load substrate with the micro light emitting diode regions, corresponding to the color, on the second medium load substrate one to one; and separating the first medium load substrate from the micro light emitting diodes with the color on the first medium load substrate so that the micro light emitting diodes with the color on the first medium load substrate are transferred into the micro light emitting diode regions, corresponding to the color, on the second medium load substrate.

During specific implementation, the material of the bonding structures may include a pyrolytic adhesive. In the embodiment of the present disclosure, the step of separating the first medium load substrate from the micro light emitting diodes with the color on the first medium load substrate may include: separating the first medium load substrate from the micro light emitting diodes with the color on the first medium load substrate by adopting a hot pressing process. In this way, due to the adoption of the hot pressing process, on one hand, the pyrolytic adhesive may be heated to lose the adhesion, so that the first medium load substrate is separated from the micro light emitting diodes with the color on the first medium load substrate. On the other hand, due to the action of a pressure, the micro light emitting diodes with the color, separated from the first medium load substrate, may be fixed into the micro light emitting diode regions, corresponding to the color, on the second medium load substrate.

During specific implementation, the material of the bonding structures may also include a photolytic adhesive. In the embodiment of the present disclosure, the step of separating the first medium load substrate from the micro light emitting diodes with the color on the first medium load substrate may include: separating the first medium load substrate from the micro light emitting diodes with the color on the first medium load substrate by virtue of laser. In this way, due to the irradiation of the laser on the first medium load substrate, the photolytic adhesive may be heated to lose the adhesion, so that the first medium load substrate is separated from the picked up micro light emitting diodes with the color.

During specific implementation, the size of the second medium load substrate may be not smaller than that of the target substrate. Exemplarily, the size of the second medium load substrate 400 may be greater than that of the target substrate 100. Or, as shown in FIG. 2a and FIG. 5, the size of the second medium load substrate 400 may also be substantially equal to that of the target substrate 100. It should be explained that some deviations may also be caused in an actual process due to restricts of process conditions or influences from other factors, and therefore, equal or same in the embodiment of the present disclosure refers to equal or same conforming to an error allowable range, or the deviations approximately conforming to the above-mentioned conditions fall within the protective scope of the present disclosure.

During specific implementation, in the embodiment of the present disclosure, the step of transferring the micro light emitting diodes on the second medium load substrate into the corresponding sub-pixels on the target substrate at one time may include:

aligning the second medium load substrate with the target substrate, and separating the second medium load substrate from the micro light emitting diodes on the second medium load substrate so that the micro light emitting diodes on the second medium load substrate are transferred into the corresponding sub-pixels on the target substrate at one time.

During specific implementation, the material of the bonding film layer on the second medium load substrate includes a photolytic adhesive. In the embodiment of the present disclosure, the step of separating the second medium load substrate from the micro light emitting diodes may include: separating the second medium load substrate from the micro light emitting diodes on the second medium load substrate by virtue of laser. In this way, due to the irradiation of the laser, the photolytic adhesive may lose the adhesion, so that the second medium load substrate is separated from the picked up micro light emitting diodes, and furthermore, the micro light emitting diodes on the second medium load substrate are transferred into the corresponding sub-pixels on the target substrate at one time.

During specific implementation, the material of the bonding film layer on the second medium load substrate may also include a pyrolytic adhesive. In the embodiment of the present disclosure, the step of separating the second medium load substrate from the micro light emitting diodes may include: separating the second medium load substrate from the micro light emitting diodes on the second medium load substrate by adopting a hot pressing process. In this way, due to the adoption of the hot pressing process, on one hand, the second medium load substrate can be separated from the picked up micro light emitting diodes, and on the other hand, the micro light emitting diodes can be more firmly bonded with the target substrate.

During specific implementation, as shown in FIG. 2b, the target substrate may further include anisotropic conductive adhesives 130 respectively located at sides, away from the target substrate 100, of each first electrode 110 and the corresponding second electrode 120. In the embodiment of the present disclosure, while or after separating the second medium load substrate from the micro light emitting diodes on the second medium load substrate, the mass transfer method may further include: electrically connecting electrodes of the micro light emitting diodes separated from the second medium load substrate to the anisotropic conductive adhesives in the corresponding sub-pixels. Exemplarily, the electrodes of the micro light emitting diodes separated from the second medium load substrate may be electrically connected to the anisotropic conductive adhesives in the corresponding sub-pixels by adopting a heating drying process. It should be explained that the anisotropic conductive adhesive 130 may be basically the same as that in the related art, and the descriptions thereof are omitted herein.

During specific implementation, the anisotropic conductive adhesive may include a colloidal material and a metal material uniformly dispersed in the colloidal material. The metal material may include Sn balls and Au. Exemplarily, as shown in FIG. 2b, the step of forming the anisotropic conductive adhesives 130 on each first electrode 110 and the corresponding second electrode 120 of the target substrate may include: firstly, uniformly dispersing the Sn balls into the colloidal material; then, coating the first electrode 110 and the second electrode 120 of the target substrate with the colloidal material into which the Sn balls are dispersed to form a conductive adhesive film layer; and patterning the conductive adhesive film layer by adopting a patterning process to form the anisotropic conductive adhesives 130 respectively located at sides, away from the target substrate 100, of the first electrode 110 and the second electrode 120, wherein the patterning process may include a photolithographic process and an etching process.

It should be explained that the anisotropic conductive adhesive simultaneously has viscosity and conductivity, and it is possible that the viscosity of the anisotropic conductive adhesive is weakened if the anisotropic conductive adhesive is vacant for a long time. Therefore, if the number of the micro light emitting diodes borne on the second medium load substrate is not greater than the number of the micro light emitting diodes borne on the first medium load substrate, it is possible that the frequency of transferring the micro light emitting diodes to the target substrate is increased, the time consumption for transfer is increased, namely the micro light emitting diodes cannot be transferred to the target substrate within short time, and furthermore, the performance of the anisotropic conductive adhesive is caused to be lowered. In the embodiment of the present disclosure, the number of the micro light emitting diodes borne on the second medium load substrate is greater than the number of the micro light emitting diodes borne on the first medium load substrate, the size of the second medium load substrate is not smaller than that of the target substrate, and one of the micro light emitting diode regions on the second medium load substrate corresponds to one of the sub-pixels on the target substrate, so that the micro light emitting diodes on the second medium load substrate can be transferred to the target substrate by only adopting a primary transfer process, furthermore, the transfer time can be shortened, it can be ensured that the performance of the anisotropic conductive adhesive is stable, and the stability of a display panel applying the target substrate can be improved.

The processes of the mass transfer methods are listed below with embodiments, but a reader should know that the specific processes are not limited herein.

The mass transfer method provided by the embodiment of the present disclosure may include the following steps.

Figure 6A:
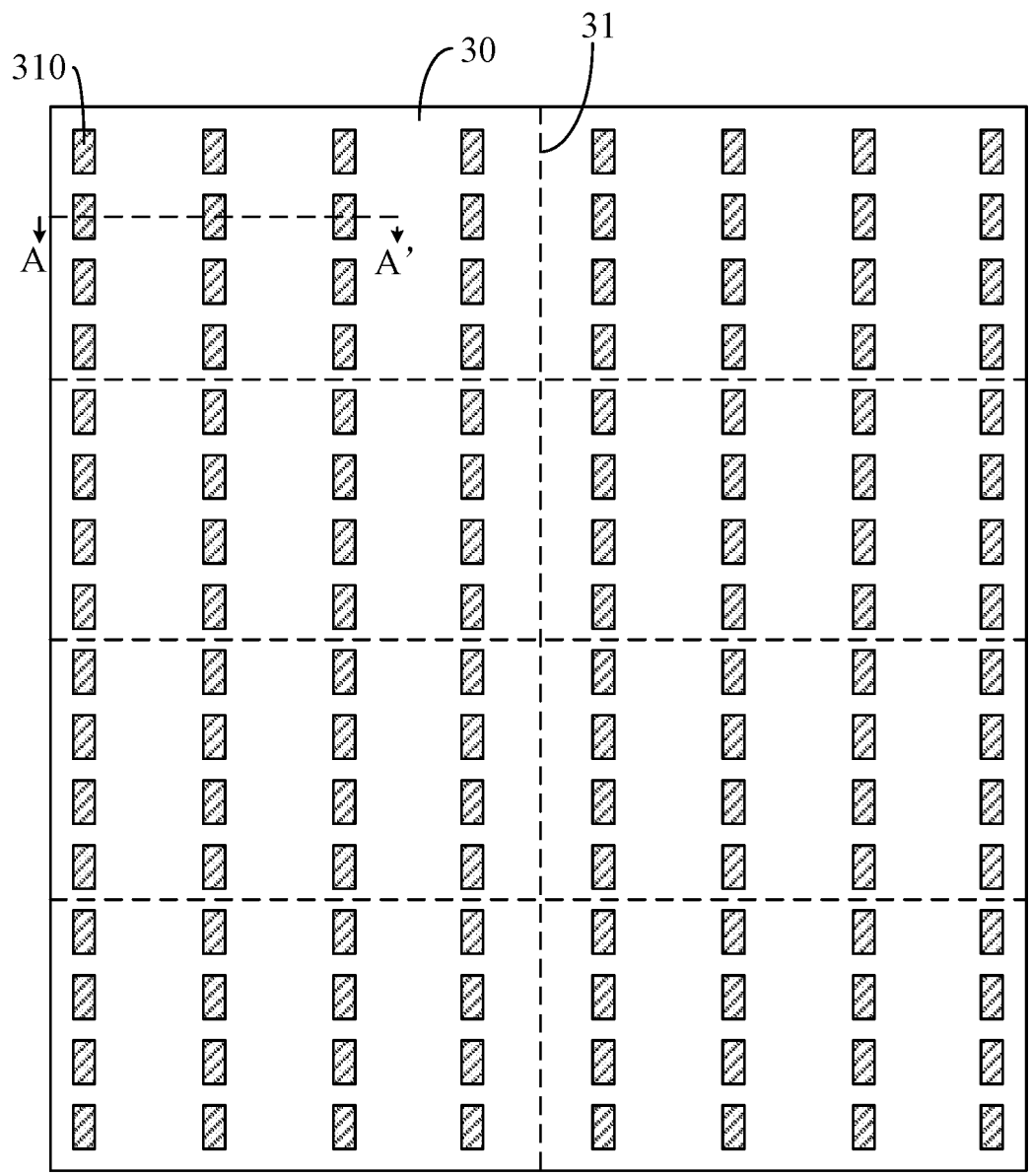
FIG. 6a to FIG. 6o are respectively schematic structural diagrams of all steps of some mass transfer methods provided by embodiments of the present disclosure.
Figure 6B:
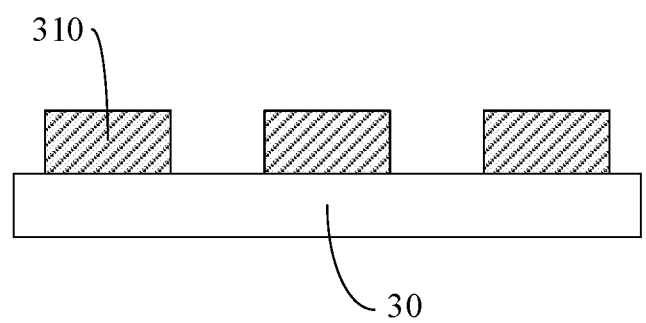

(1) A bonding material layer is formed on a first medium load substrate motherboard 30 by adopting a pyrolytic adhesive, and then, the bonding material layer is patterned by adopting a photolithographic process and an etching process in sequence to form a plurality of bonding structures 310 arranged in an array, as shown in FIG. 6a and FIG. 6b.

FIG. 6a is a schematic diagram of a top-view structure, and FIG. 6b is a schematic diagram of a sectional structure in FIG. 6a in an AA' direction.

Figure 6C:
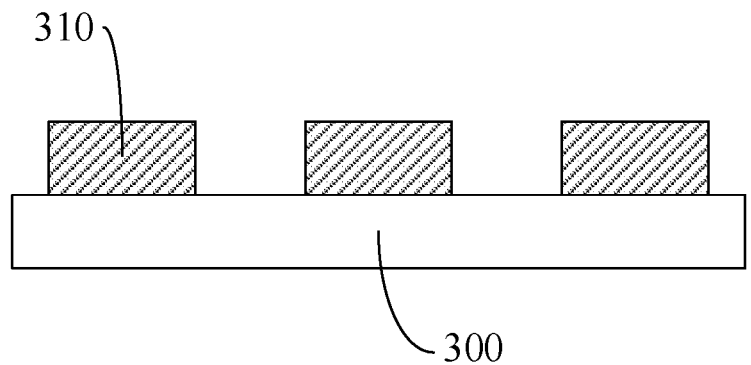

(2) The first medium load substrate motherboard 30 is cut along a cutting line 31 to obtain a first medium load substrate 300 on which a plurality of bonding structures 310 arranged in an array are formed, as shown in FIG. 4 and FIG. 6c. FIG. 6c is a schematic diagram of a sectional structure in FIG. 4 in the AA' direction.

(3) A wafer 200-R provided with a plurality of red micro light emitting diodes W-R arranged in an array, a wafer 200-G provided with a plurality of green micro light emitting diodes W-G arranged in an array and a wafer 200-B provided with a plurality of blue micro light emitting diodes W-B arranged in an array are provided, as shown in FIG. 3a to FIG. 3f.

Figure 6D:
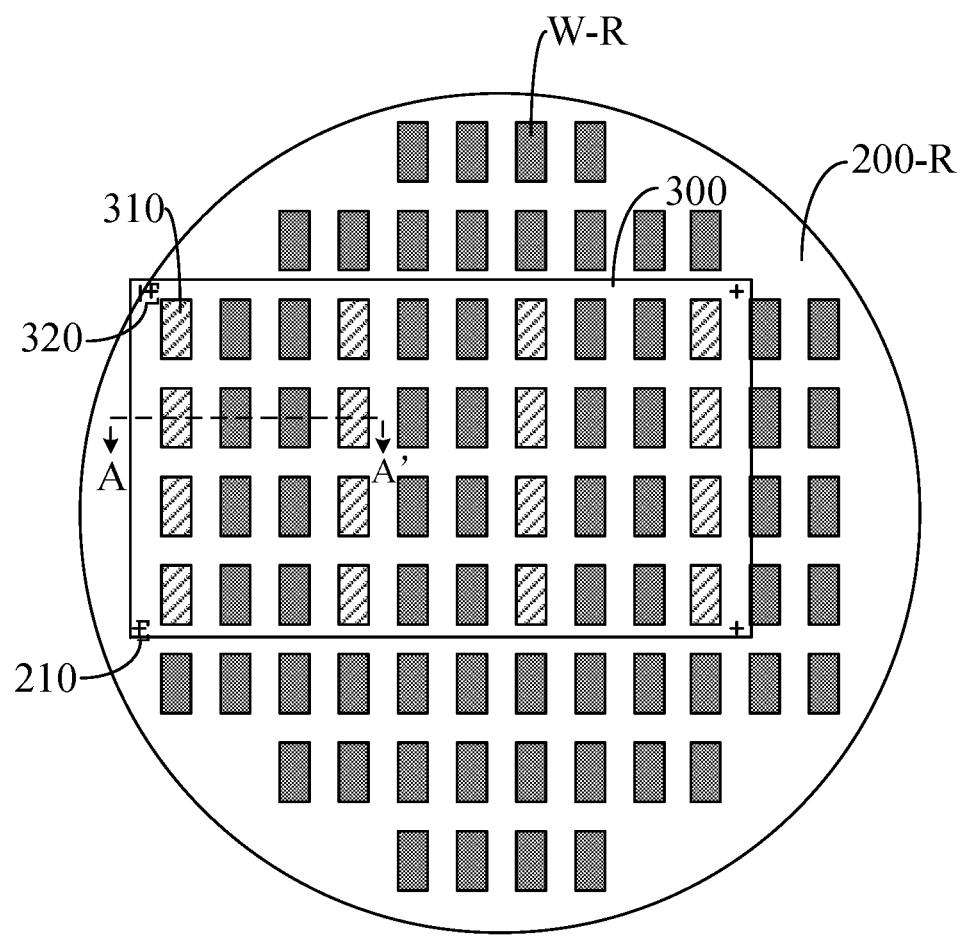
Figure 6E:
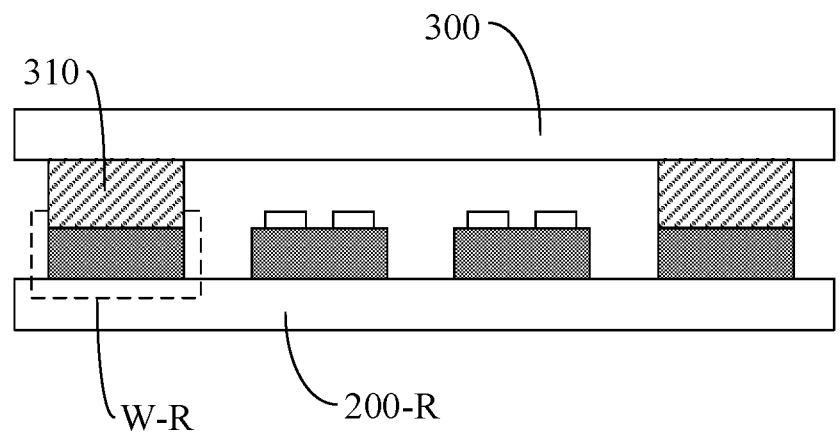

(4) The first medium load substrate 300 is aligned with the wafer 200-R; as shown in FIG. 4, FIG. 3a, FIG. 6d and FIG. 6e, the first medium load substrate 300 may be rectangular such as oblong or square. In this way, four corners of the first medium load substrate 300 may be provided with first medium load alignment signs 320. Moreover, the wafer 200-R is also provided with component alignment signs 210. In this way, the first medium load alignment signs 320 may be controlled to be aligned with the component alignment signs 210, so that the bonding structures 310 on the first medium load substrate 300 can be aligned with to-be-picked-up red micro light emitting diodes W-R on the wafer 200-R one to one. Then, the bonding structures 310 on the aligned first medium load substrate 300 are bonded with the to-be-picked-up red micro light emitting diodes W-R on the wafer 200-R one to one, so that the bonding structures 310 are bonded with the to-be-picked-up red micro light emitting diodes W-R. FIG. 6d is a schematic diagram of a top-view structure, and FIG. 6e is a schematic diagram of a sectional structure in FIG. 6d in the AA' direction.

Figure 6F:
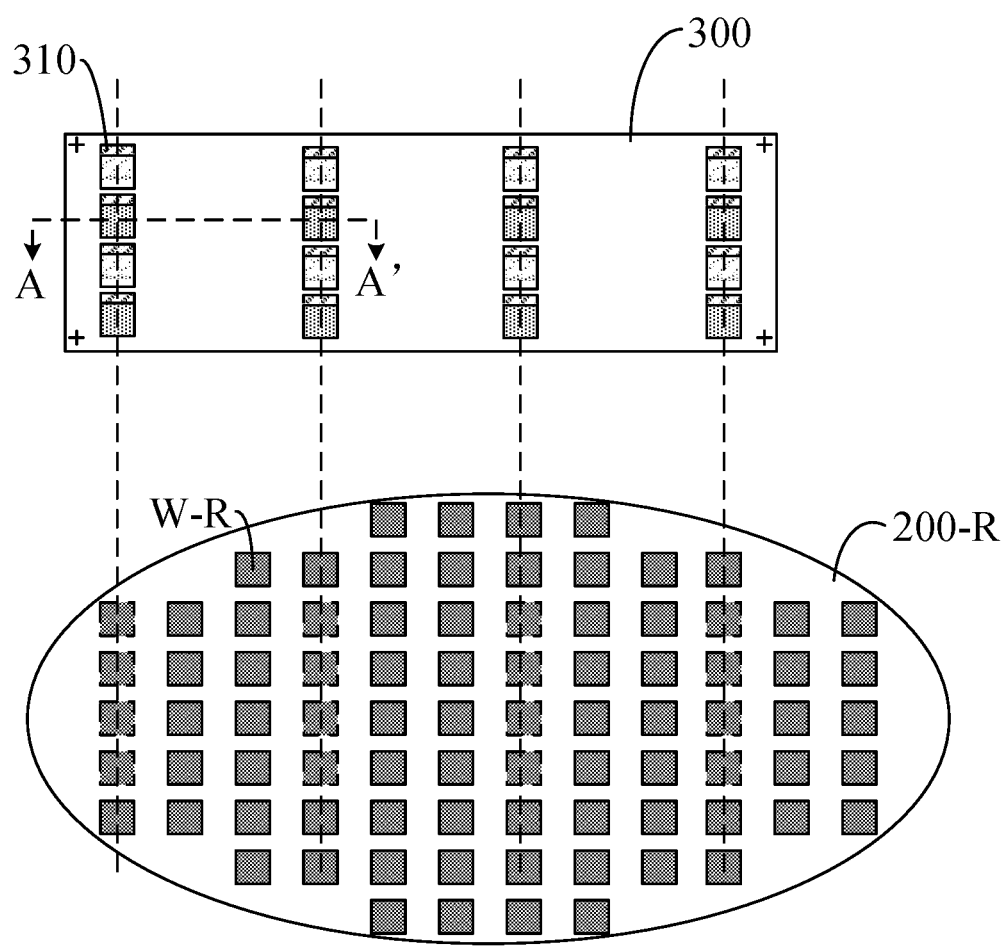
Figure 6G:
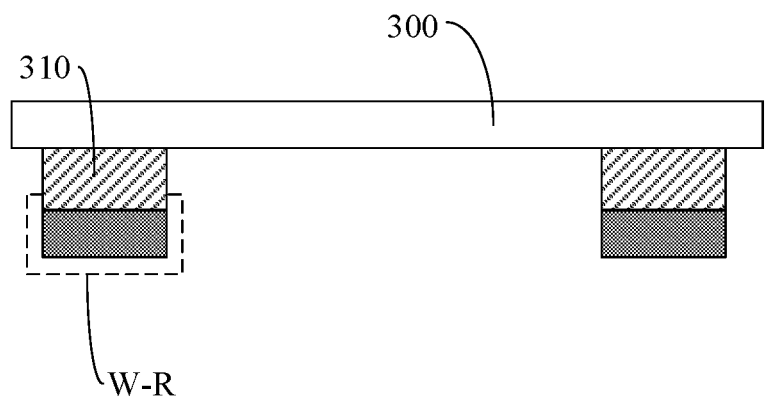

(5) Due to the adoption of a heat drying process, on one hand, the wafer 200-R can be separated from the to-be-picked-up red micro light emitting diodes W-R, and on the other hand, the bonding structures 310 can be more firmly bonded with the to-be-picked-up red micro light emitting diodes W-R. Therefore, the bonded red micro light emitting diodes W-R are picked up by the first medium load substrate 300, as shown in FIG. 6f and FIG. 6g. In FIG. 6f, a dotted line part on the wafer 200-R represents for the red micro light emitting diodes W-R which have been picked up by the first medium load substrate 300. FIG. 6f is a schematic diagram of a top-view structure, and FIG. 6g is a schematic diagram of a sectional structure in FIG. 6f in the AA' direction.

Figure 6H:
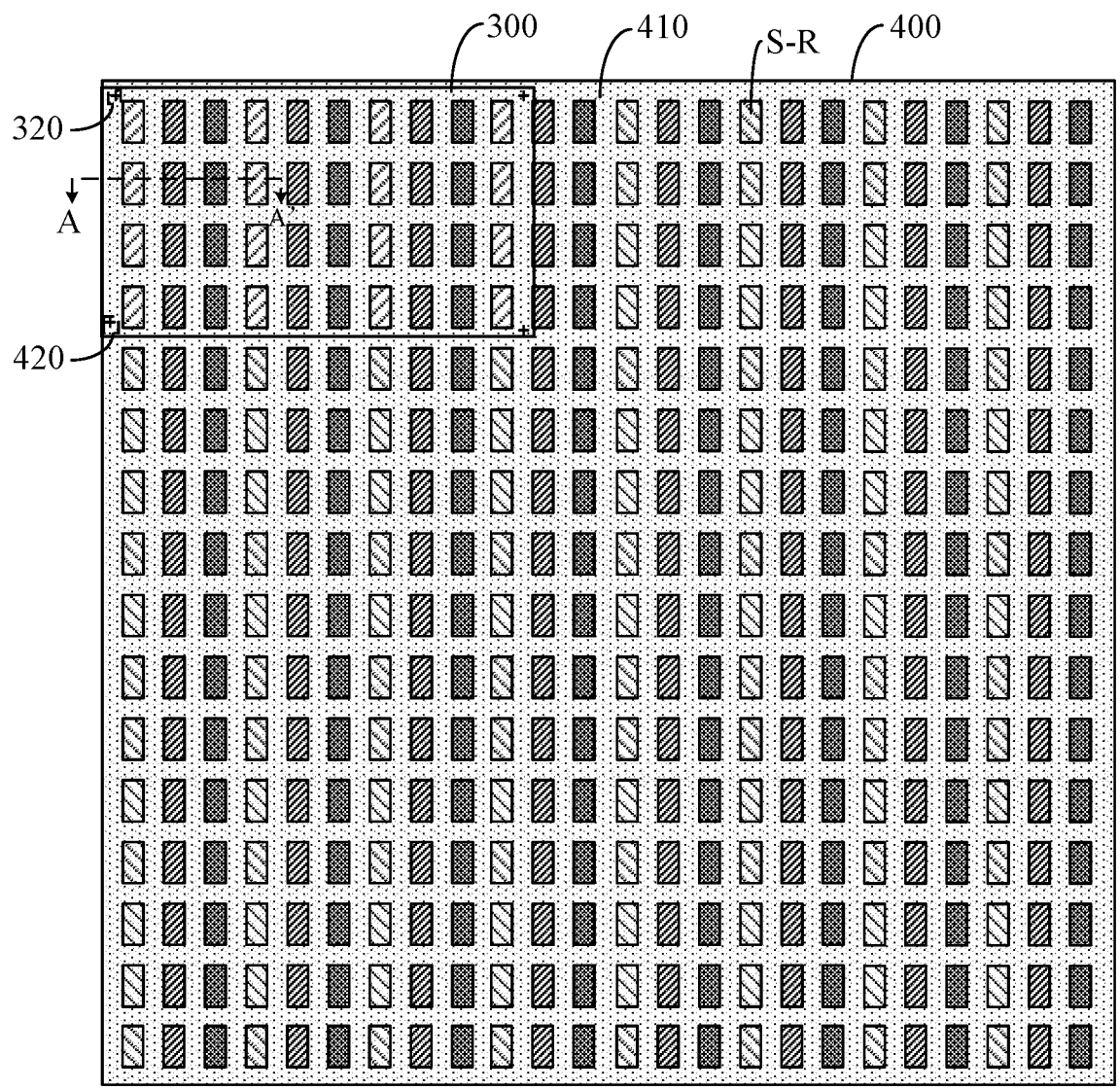
Figure 6I:
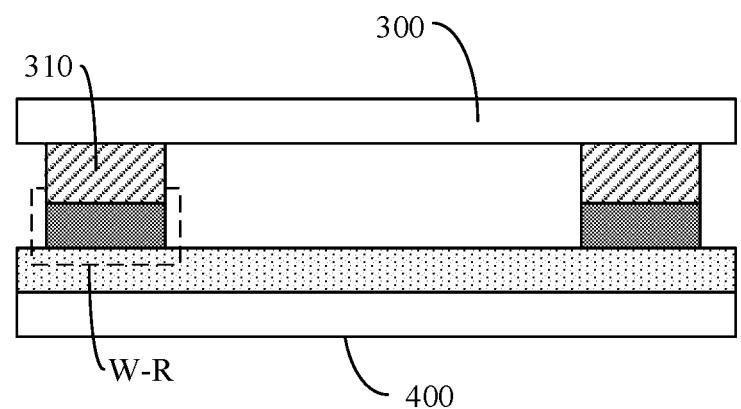

(6) The first medium load substrate 300 is aligned with a second medium load substrate 400; as shown in FIG. 4, FIG. 5, and FIG. 6f to FIG. 6i, the second medium load substrate 400 may be, for example, oblong and has the same size with a target substrate. In this way, four corners of the second medium load substrate 400 may be provided with second medium load alignment signs 420. Thus, the first medium load alignment signs 320 may be controlled to be aligned with the second medium load alignment signs 420, so that the red micro light emitting diodes W-R bonded on the first medium load substrate 300 can be aligned with bonding film layers in micro light emitting diode regions S-R, corresponding to red, on the second medium load substrate 400 one to one. Then, the red micro light emitting diodes W-R bonded on the aligned first medium load substrate 300 are bonded with the bonding film layers in the micro light emitting diode regions S-R, corresponding to red, on the second medium load substrate 400 one to one, so that the bonding film layers 410 are bonded with the red micro light emitting diodes W-R. FIG. 6h is a schematic diagram of a top-view structure, and FIG. 6i is a schematic diagram of a sectional structure in FIG. 6h in the AA' direction.

Figure 6J:
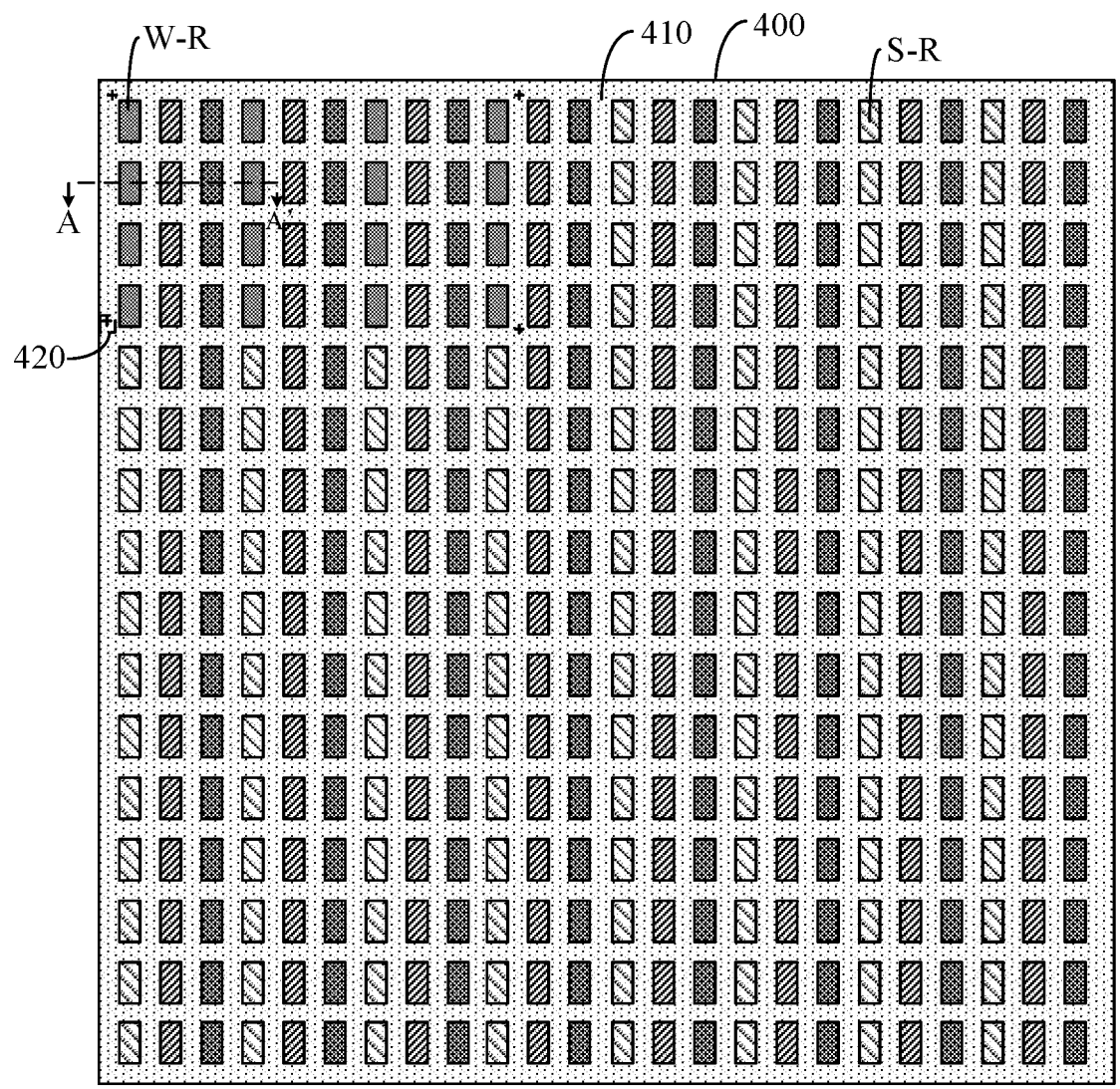
Figure 6K:
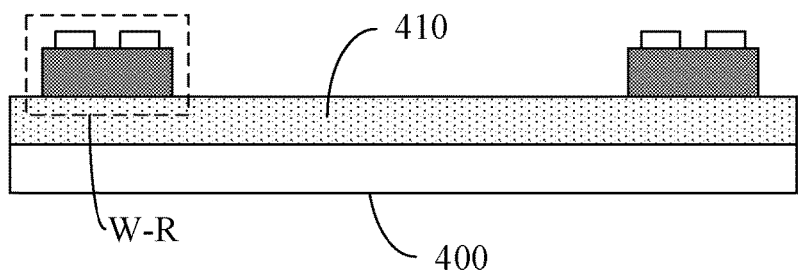

(7) Due to the adoption of a hot pressing process, on one hand, the first medium load substrate 300 can be separated from the red micro light emitting diodes W-R on the first medium load substrate 300, and on the other hand, the bonding film layers 410 can be more firmly bonded with the red micro light emitting diodes W-R. Therefore, the bonded red micro light emitting diodes W-R are picked up by the second medium load substrate 400. Furthermore, the red micro light emitting diodes W-R picked up by the first medium load substrate 300 at the first time are transferred into the micro light emitting diode regions S-R, corresponding to red, on the second medium load substrate 400, as shown in FIG. 6j and FIG. 6k. FIG. 6j is a schematic diagram of a top-view structure, and FIG. 6k is a schematic diagram of a sectional structure in FIG. 6j in the AA' direction.

Figure 6L:
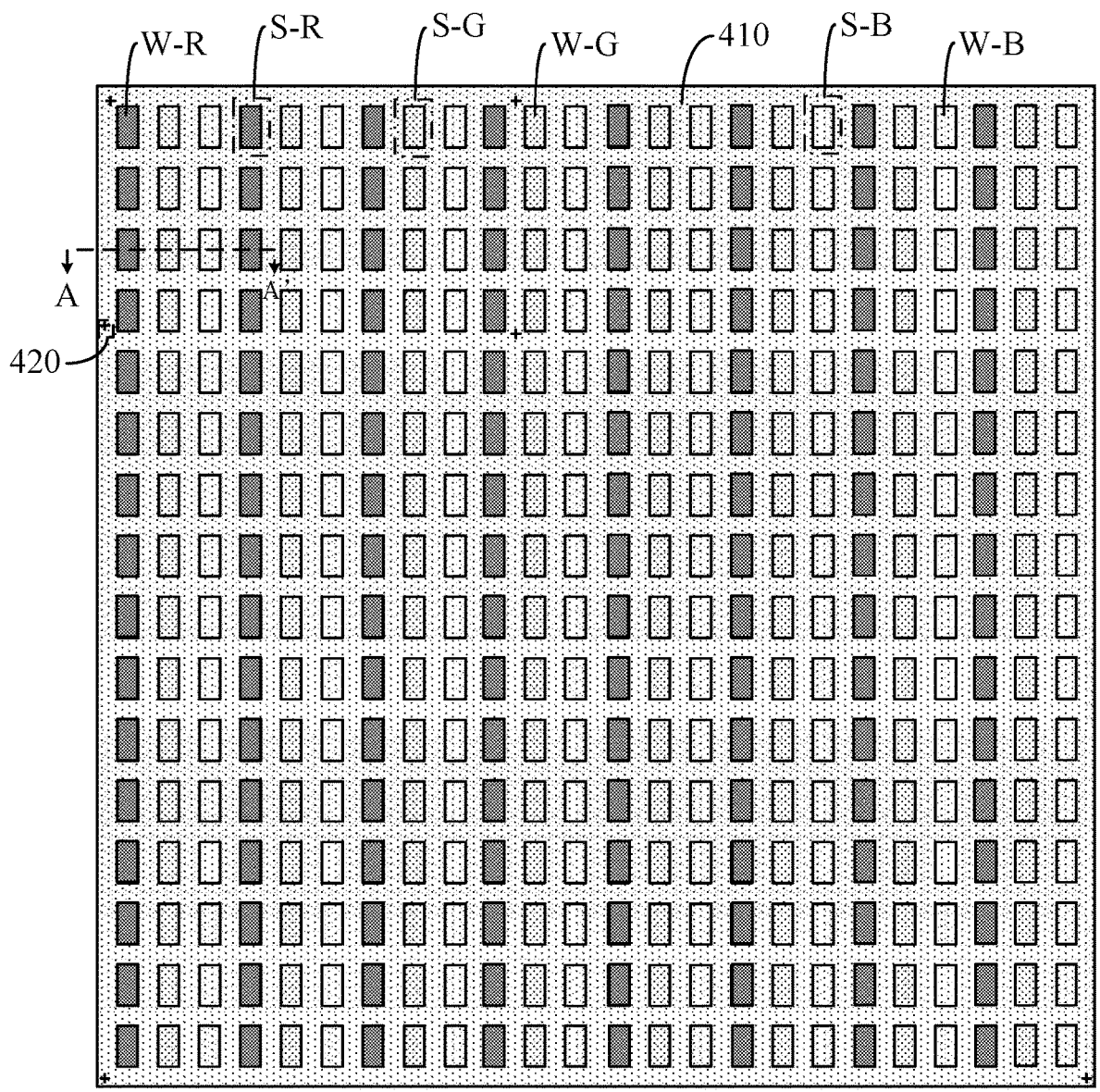
Figure 6M:
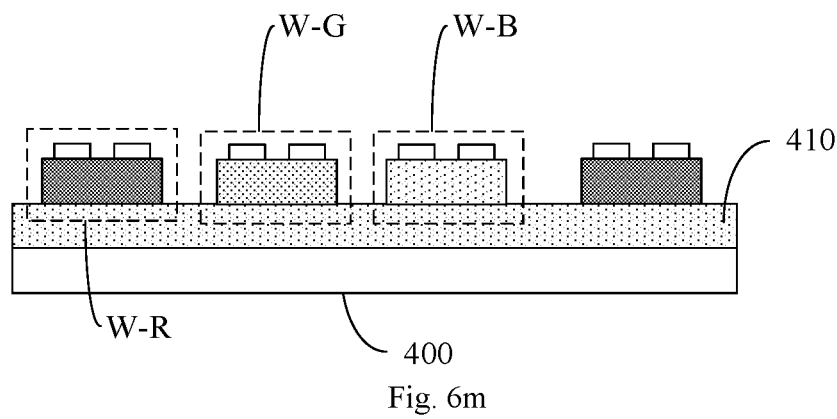

Then, the processes of the above-mentioned steps (4)-(7) are repeated, so that the red micro light emitting diodes W-R are respectively bonded in the micro light emitting diode regions S-R, corresponding to red, on the second medium load substrate 400, as shown in FIG. 6l and FIG. 6m. FIG. 6l is a schematic diagram of a top-view structure, and FIG. 6m is a schematic diagram of a sectional structure in FIG. 6l in the AA' direction.

Then, the processes of the above-mentioned steps (4)-(7) are repeated, the green micro light emitting diodes W-G on the wafer 200-G are picked up by the bonding structures 310 on the first medium load substrate 300 for many times, and the green micro light emitting diodes W-G picked up every time are transferred into the micro light emitting diode regions S-G, corresponding to green, on the second medium load substrate 400, so that the green micro light emitting diodes W-G are arranged in all the micro light emitting diode regions S-G, corresponding to green, on the second medium load substrate 400, as shown in FIG. 6l and FIG. 6m.

Then, the processes of the above-mentioned steps (4)-(7) are repeated, the blue micro light emitting diodes W-B on the wafer 200-B are picked up by the bonding structures 310 on the first medium load substrate 300 for many times, and the blue micro light emitting diodes W-B picked up every time are transferred into the micro light emitting diode regions S-B, corresponding to blue, on the second medium load substrate 400, so that the blue micro light emitting diodes W-B are arranged in all the micro light emitting diode regions S-B, corresponding to blue, on the second medium load substrate 400, as shown in FIG. 6l and FIG. 6m.

Figure 6N:
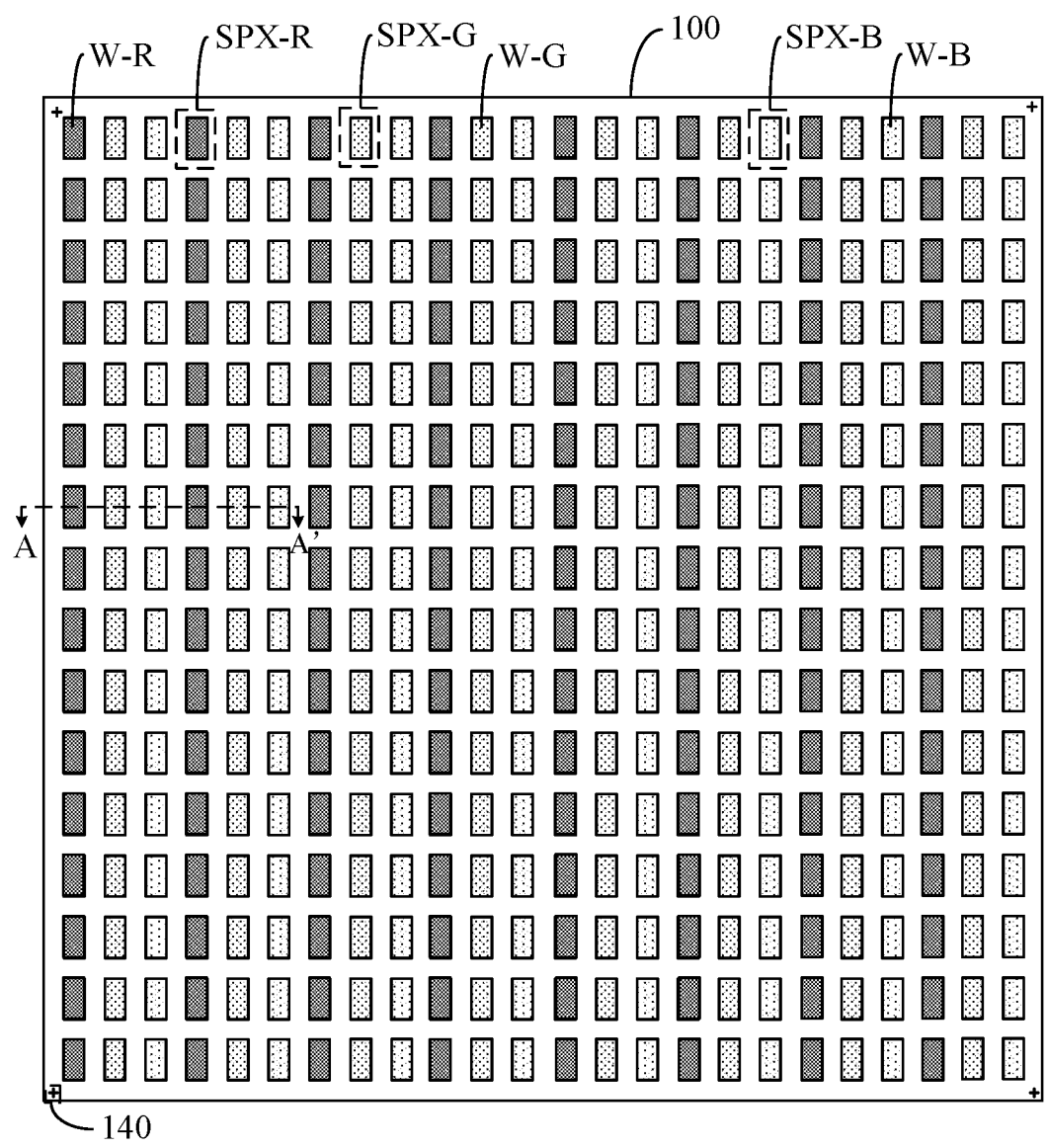
Figure 6O:
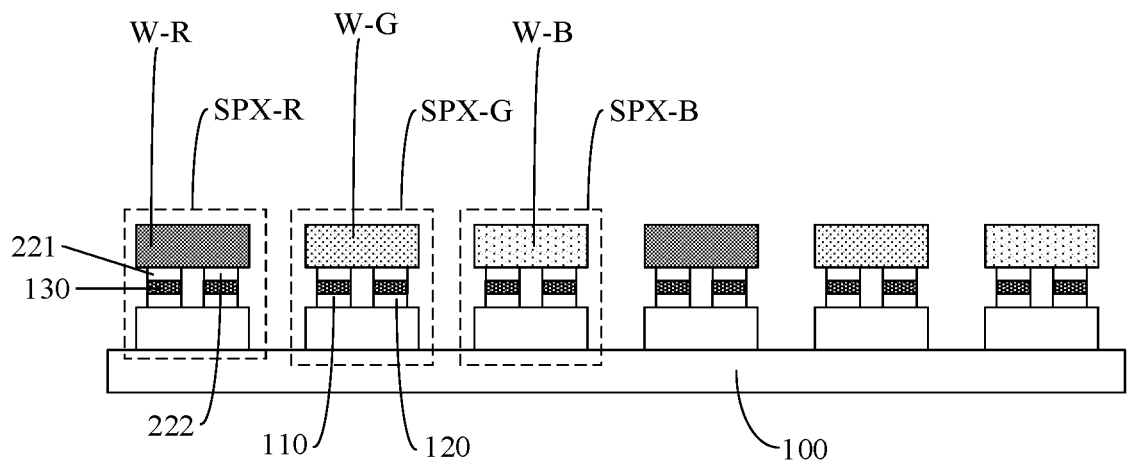

(8) The second medium load substrate 400 is aligned with the target substrate 100. As shown in FIG. 2a, FIG. 2b, and FIG. 6l to FIG. 6o, four corners of the target substrate 100 are provided with target alignment signs 140. In this way, the second medium load alignment signs 420 may be controlled to be aligned with the target alignment signs 140, so that the red micro light emitting diodes W-R bonded on the second medium load substrate 400 can be aligned with the red sub-pixels SPX-R on the target substrate 100 one to one, the green micro light emitting diodes W-G bonded on the second medium load substrate 400 can be aligned with the green sub-pixels SPX-G on the target substrate 100 one to one, and the blue micro light emitting diodes W-B bonded on the second medium load substrate 400 can be aligned with the blue sub-pixels SPX-B on the target substrate 100 one to one. FIG. 6n is a schematic diagram of a top-view structure, and FIG. 6o is a schematic diagram of a sectional structure in FIG. 6n in the AA' direction.

(9) As shown in FIG. 6n and FIG. 6o, due to the irradiation of laser on the second medium load substrate, the bonding film layers 410 formed by a photolytic adhesive lose adhesion, so that the second medium load substrate is separated from the micro light emitting diodes on the second medium load substrate. Then, due to the adoption of a heat drying process, the micro light emitting diodes on the second medium load substrate are transferred into the corresponding sub-pixels on the target substrate at one time, and due to the action of a pressure, the electrodes of the micro light emitting diodes are electrically connected to anisotropic conductive adhesives in the corresponding sub-pixels. An anode 221 of each micro light emitting diode may be electrically connected to the corresponding first electrode 110 through the corresponding anisotropic conductive adhesive 130, and a cathode 222 of each micro light emitting diode may be electrically connected to the corresponding second electrode 120 through the corresponding anisotropic conductive adhesive 130.

Some another mass transfer methods for micro light emitting diodes, provided by an embodiment of the present disclosure, are modified with specific to the implementation ways in the above-mentioned embodiment. The differences between the present embodiment and the above-mentioned embodiment are only described below, and the similarities thereof are omitted herein.

(1) A bonding material layer is formed on a first medium load substrate motherboard 30 by adopting a photolytic adhesive, and then, the bonding material layer is patterned by adopting a photolithographic process and an etching process in sequence to form a plurality of bonding structures 310 arranged in an array, as shown in FIG. 6a and FIG. 6b.

Steps (2)-(6) may be basically the same as steps (2)-(6) in the above-mentioned embodiment, and the descriptions thereof are omitted herein.

(7) Due to the irradiation of laser, the first medium load substrate 300 is separated from the red micro light emitting diodes W-R on the first medium load substrate 300, and then, due to the adoption of a heat drying process, the bonding film layers 410 may be more firmly bonded with the red micro light emitting diodes W-R. Therefore, the bonded red micro light emitting diodes W-R are picked up by the second medium load substrate 400. Furthermore, the red micro light emitting diodes W-R picked up by the first medium load substrate 300 at the first time are transferred into the micro light emitting diode regions S-R, corresponding to red, on the second medium load substrate 400, as shown in FIG. 6j and FIG. 6k.

Then, the processes of the above-mentioned steps (4)-(7) are repeated, so that the red micro light emitting diodes W-R are respectively bonded in the micro light emitting diode regions S-R, corresponding to red, on the second medium load substrate 400, as shown in FIG. 6l and FIG. 6m.

Then, the processes of the above-mentioned steps (4)-(7) are repeated, the green micro light emitting diodes W-G on the wafer 200-G are picked up by the bonding structures 310 on the first medium load substrate 300 for many times, and the green micro light emitting diodes W-G picked up every time are transferred into the micro light emitting diode regions S-G, corresponding to green, on the second medium load substrate 400, so that the green micro light emitting diodes W-G are arranged in all the micro light emitting diode regions S-G, corresponding to green, on the second medium load substrate 400, as shown in FIG. 6l and FIG. 6m.

Then, the processes of the above-mentioned steps (4)-(7) are repeated, the blue micro light emitting diodes W-B on the wafer 200-B are picked up by the bonding structures 310 on the first medium load substrate 300 for many times, and the blue micro light emitting diodes W-B picked up every time are transferred into the micro light emitting diode regions S-B, corresponding to blue, on the second medium load substrate 400, so that the blue micro light emitting diodes W-B are arranged in all the micro light emitting diode regions S-B, corresponding to blue, on the second medium load substrate 400, as shown in FIG. 6*l* and FIG. 6*m*.

(8) The second medium load substrate 400 is aligned with the target substrate 100. As shown in FIG. 2*a*, FIG. 2*b*, and FIG. 6*l* to FIG. 6*o*, four corners of the target substrate 100 are provided with target alignment signs 140. In this way, the second medium load alignment signs 420 may be controlled to be aligned with the target alignment signs 140, so that the red micro light emitting diodes W-R bonded on the second medium load substrate 400 can be aligned with the red sub-pixels SPX-R on the target substrate 100 one to one, the green micro light emitting diodes W-G bonded on the second medium load substrate 400 can be aligned with the green sub-pixels SPX-G on the target substrate 100 one to one, and the blue micro light emitting diodes W-B bonded on the second medium load substrate 400 can be aligned with the blue sub-pixels SPX-B on the target substrate 100 one to one.

(9) As shown in FIG. 6*n* and FIG. 6*o*, due to the adoption of a hot pressing process, on one hand, the bonding film layers 410 formed by a pyrolytic adhesive may lose adhesion, so that the second medium load substrate is separated from the micro light emitting diodes on the second medium load substrate. On the other hand, due to the action of a pressure, the electrodes of the micro light emitting diodes are electrically connected to anisotropic conductive adhesives in the corresponding sub-pixels, and the micro light emitting diodes on the second medium load substrate are transferred into the corresponding sub-pixels on the target substrate at one time.

Some further mass transfer methods for micro light emitting diodes, provided by an embodiment of the present disclosure, are modified with specific to the implementation ways in the above-mentioned embodiments. The differences between the present embodiment and the above-mentioned embodiments are only described below, and the similarities thereof are omitted herein.

During specific implementation, in the embodiment of the present disclosure, micro light emitting diodes with one color may also correspond to one of first medium load substrates. Exemplarily, the red micro light emitting diodes correspond to a first medium load substrate 300-R, the green micro light emitting diodes correspond to a second first medium load substrate 300-G, and the blue micro light emitting diodes correspond to a third first medium load substrate 300-B.

During specific implementation, in the embodiment of the present disclosure, the step of picking up the micro light emitting diodes on the component substrate at least once by the plurality of bonding structures on the first medium load substrate, and transferring micro light emitting diodes picked up every time to the second medium load substrate includes:

for the micro light emitting diodes with each color, picking up the micro light emitting diodes with the color on the component substrate for many times by the first medium load substrate corresponding to the color, and transferring the micro light emitting diodes with the color picked up every time into micro light emitting diode regions, corresponding to the color, on the second medium load substrate. Exemplarily, for the red micro light emitting diodes W-R, the micro light emitting diodes W-R on the component substrate 200-R may be picked up by the bonding structures 310 on the first medium load substrate 300 corresponding to red for many times, and the red micro light emitting diodes picked up every time are transferred into the micro light emitting diode regions S-R, corresponding to red, on the second medium load substrate 400, so that the red micro light emitting diodes W-R are arranged in all the micro light emitting diode regions S-R, corresponding to red, on the second medium load substrate 400.

The processes of the mass transfer methods are listed below with embodiments, but it should be known that the specific processes are not limited herein.

In addition to steps (1)-(3) and steps (8)-(9) in the above-mentioned embodiments, the mass transfer methods provided by the embodiments of the present disclosure may further include the following steps.

Figure 7A:
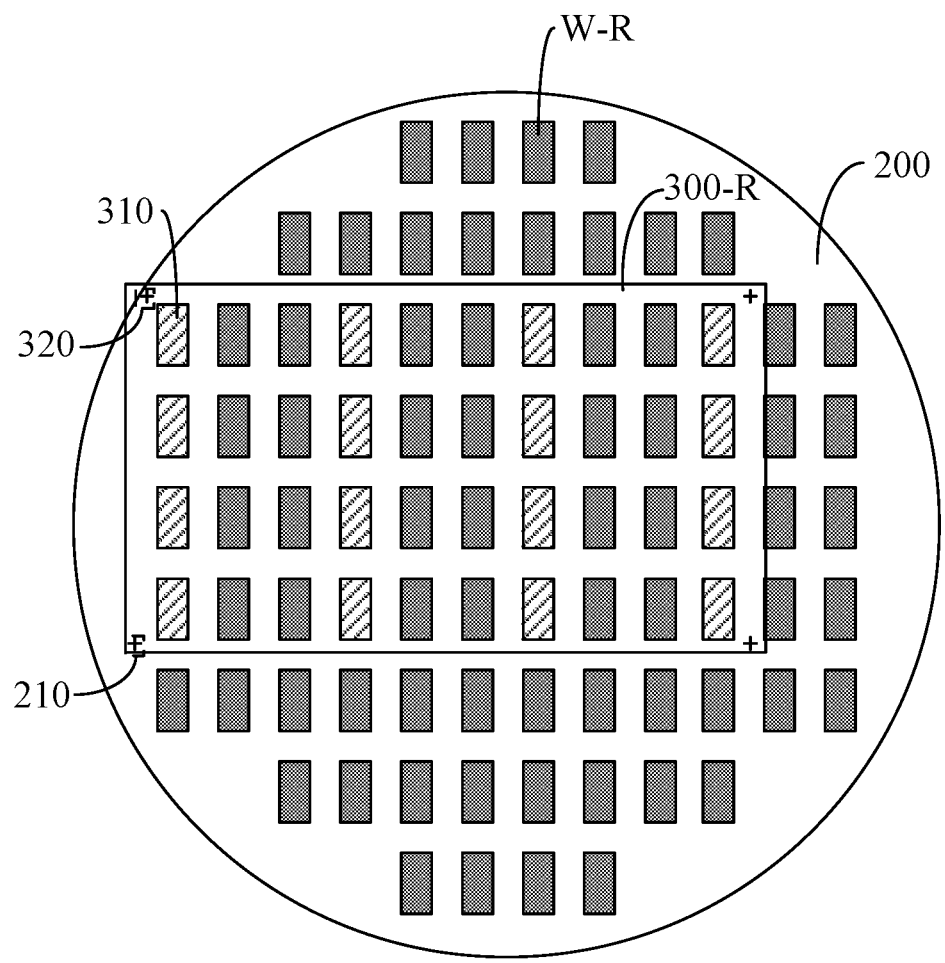
FIG. 7a to FIG. 7g are respectively schematic structural diagrams of all steps of some another mass transfer methods provided by embodiments of the present disclosure.

(4) The first medium load substrate 300-R corresponding to red is aligned with a wafer 200-R; as shown in FIG. 4, FIG. 3*a* and FIG. 7*a*, the first medium load substrate 300-R may be rectangular such as oblong or square. In this way, four corners of the first medium load substrate 300-R may be provided with first medium load alignment signs 320. Moreover, the wafer 200-R is also provided with component alignment signs 210. In this way, the first medium load alignment signs 320 may be controlled to be aligned with the component alignment signs 210, so that the bonding structures 310 on the first medium load substrate 300-R can be aligned with to-be-picked-up red micro light emitting diodes W-R on the wafer 200-R one to one. Then, the bonding structures 310 on the aligned first medium load substrate 300-R are bonded with the to-be-picked-up red micro light emitting diodes W-R on the wafer 200-R one to one, so that the bonding structures 310 are bonded with the to-be-picked-up red micro light emitting diodes W-R.

Figure 7B:
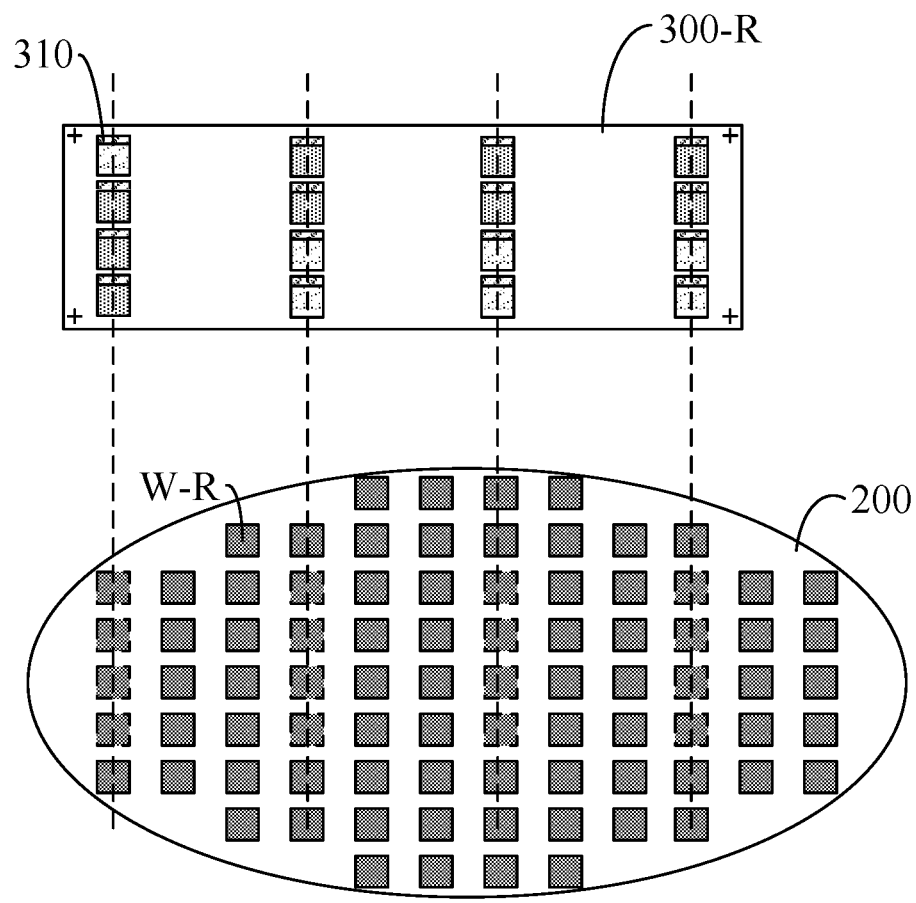
Figure 7C:
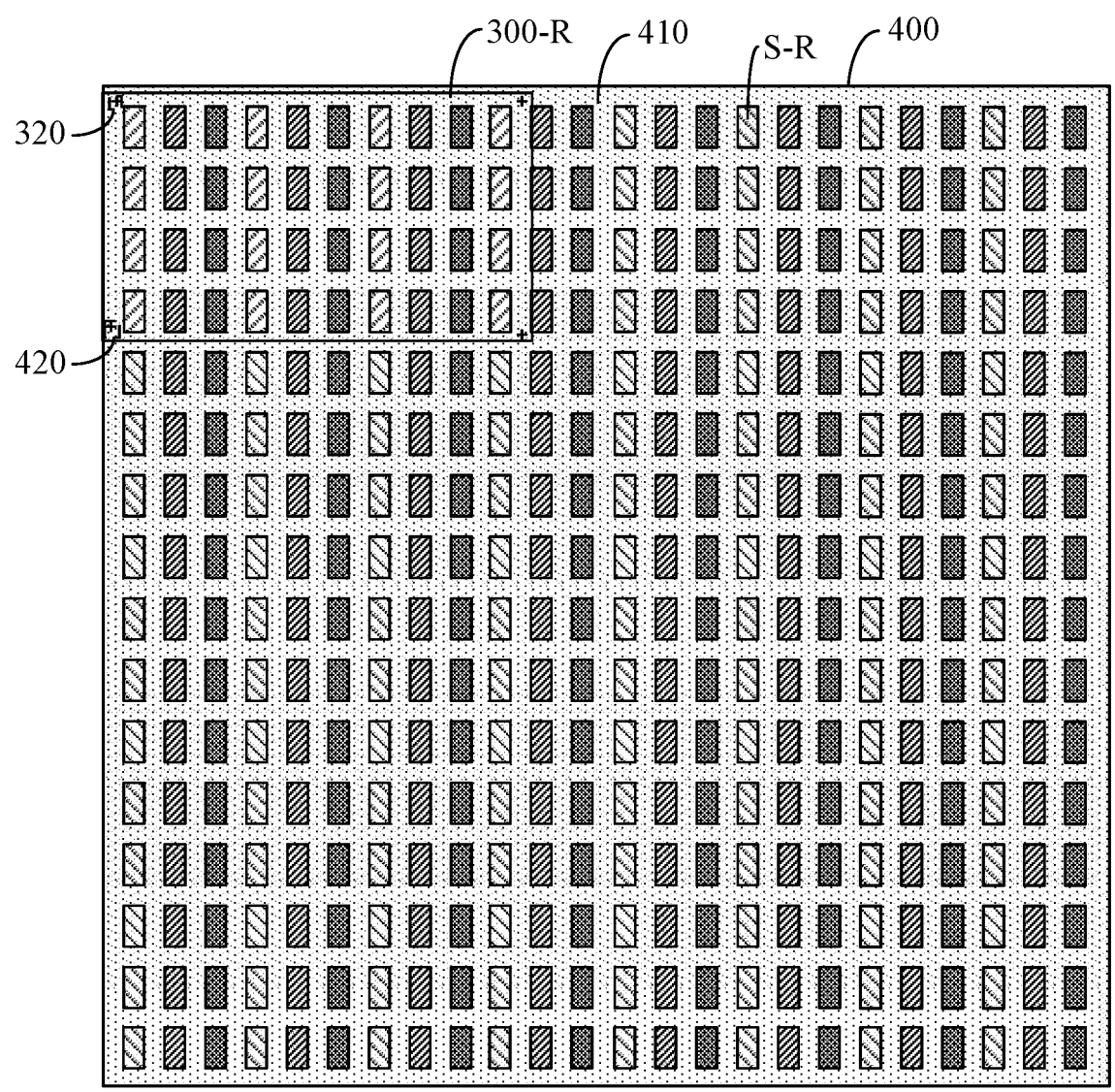

(5) Due to the adoption of a heat drying process, on one hand, the wafer 200-R can be separated from the to-be-picked-up red micro light emitting diodes W-R, and on the other hand, the bonding structures 310 can be more firmly bonded with the to-be-picked-up red micro light emitting diodes W-R. Therefore, the bonded red micro light emitting diodes W-R are picked up by the first medium load substrate 300, as shown in FIG. 7*b*. In FIG. 7*b*, a dotted line part on the wafer 200-R represents for the red micro light emitting diodes W-R which have been picked up by the first medium load substrate 300-R.

(6) The first medium load substrate 300-R is aligned with a second medium load substrate 400; as shown in FIG. 4, FIG. 5, FIG. 7*b* and FIG. 7*c*, the second medium load substrate 400 may be, for example, oblong and has the same size with a target substrate. In this way, four corners of the second medium load substrate 400 may be provided with second medium load alignment signs 420. Thus, the first medium load alignment signs 320 may be controlled to be aligned with the second medium load alignment signs 420, so that the red micro light emitting diodes W-R bonded on the first medium load substrate 300-R can be aligned with bonding film layers in micro light emitting diode regions S-R, corresponding to red, on the second medium load substrate 400 one to one. Then, the red micro light emitting diodes W-R bonded on the aligned first medium load substrate 300-R are bonded with the bonding film layers in the micro light emitting diode regions S-R, corresponding to red, on the second medium load substrate 400 one to one, so that the bonding film layers 410 are bonded with the red micro light emitting diodes W-R.

(7) Due to the adoption of a hot pressing process, on one hand, the first medium load substrate 300-R can be separated from the red micro light emitting diodes W-R on the first medium load substrate 300-R, and on the other hand, the bonding film layers 410 can be more firmly bonded with the red micro light emitting diodes W-R. Therefore, the bonded red micro light emitting diodes W-R are picked up by the second medium load substrate 400. Furthermore, the red micro light emitting diodes W-R picked up by the first medium load substrate 300-R at the first time are transferred into the micro light emitting diode regions S-R, corresponding to red, on the second medium load substrate 400, as shown in FIG. 6*j* and FIG. 6*k*.

Then, the processes of the above-mentioned steps (4)-(7) are repeated, so that the red micro light emitting diodes W-R are respectively bonded in the micro light emitting diode regions S-R, corresponding to red, on the second medium load substrate 400, as shown in FIG. 6*l* and FIG. 6*m*.

Figure 7D:
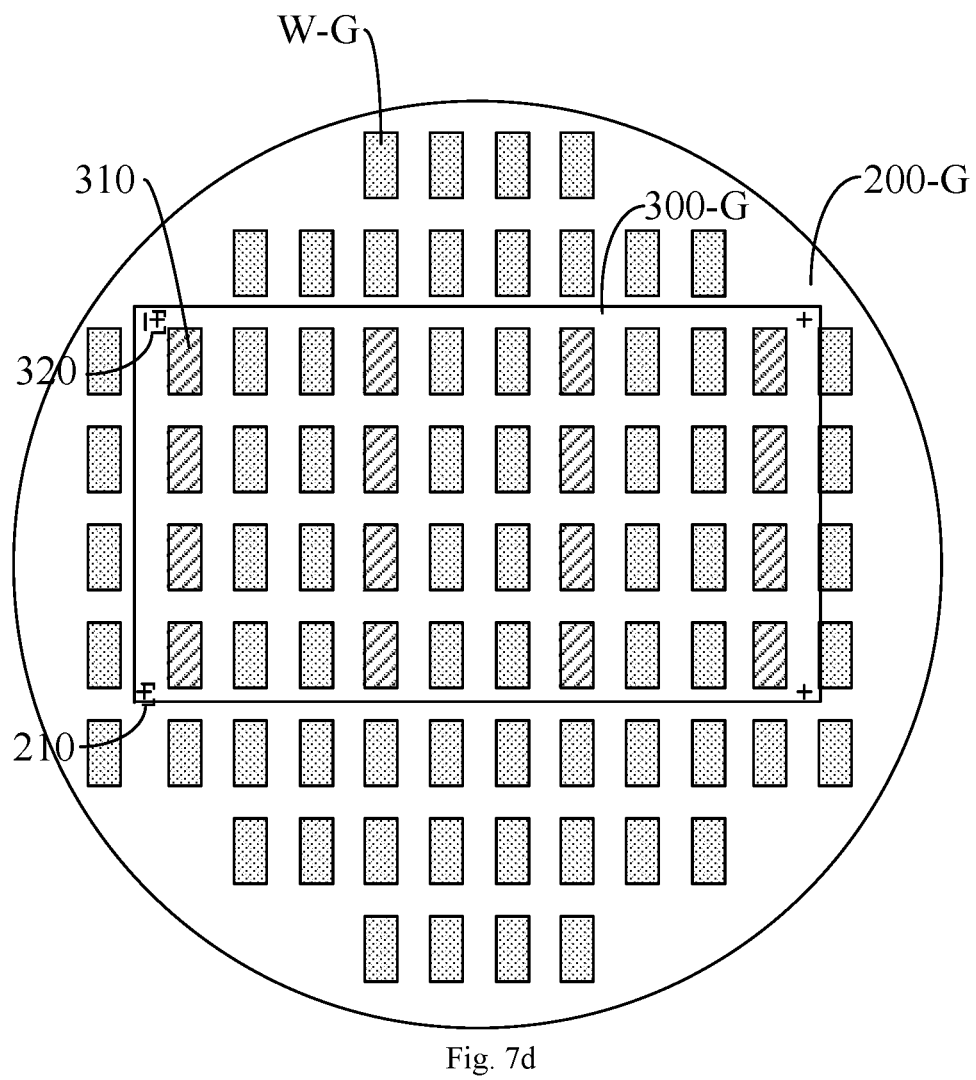

(8) The second first medium load substrate 300-G corresponding to green is aligned with a wafer 200-G; as shown in FIG. 4, FIG. 3*b* and FIG. 7*d*, the first medium load substrate 300-G may be rectangular such as oblong or square. In this way, four corners of the first medium load substrate 300-G may be provided with first medium load alignment signs 320. Moreover, the wafer 200-G is also provided with component alignment signs 210. In this way, the first medium load alignment signs 320 may be controlled to be aligned with the component alignment signs 210, so that the bonding structures 310 on the first medium load substrate 300-G can be aligned with to-be-picked-up green micro light emitting diodes W-G on the wafer 200-G one to one. Then, the bonding structures 310 on the aligned first medium load substrate 300-G are bonded with the to-be-picked-up green micro light emitting diodes W-G on the wafer 200-G one to one, so that the bonding structures 310 are bonded with the to-be-picked-up green micro light emitting diodes W-G.

Figure 7E:
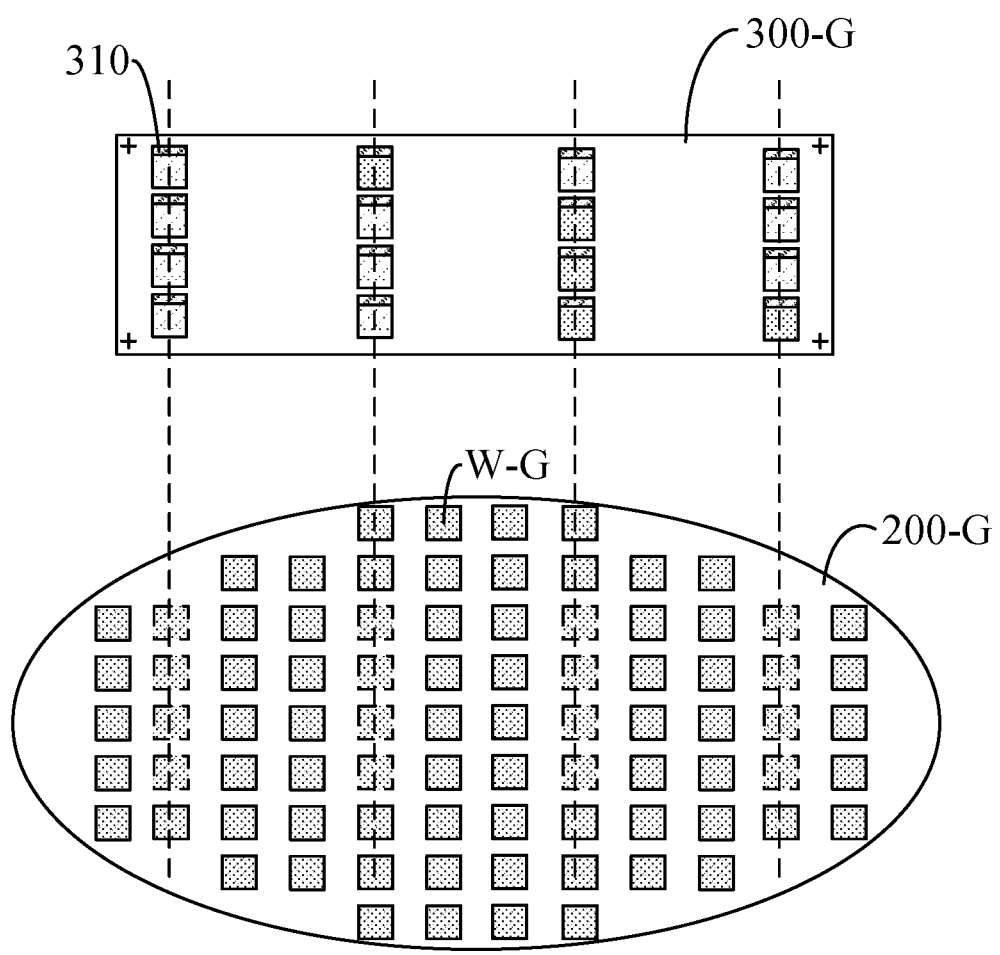
Figure 7F:
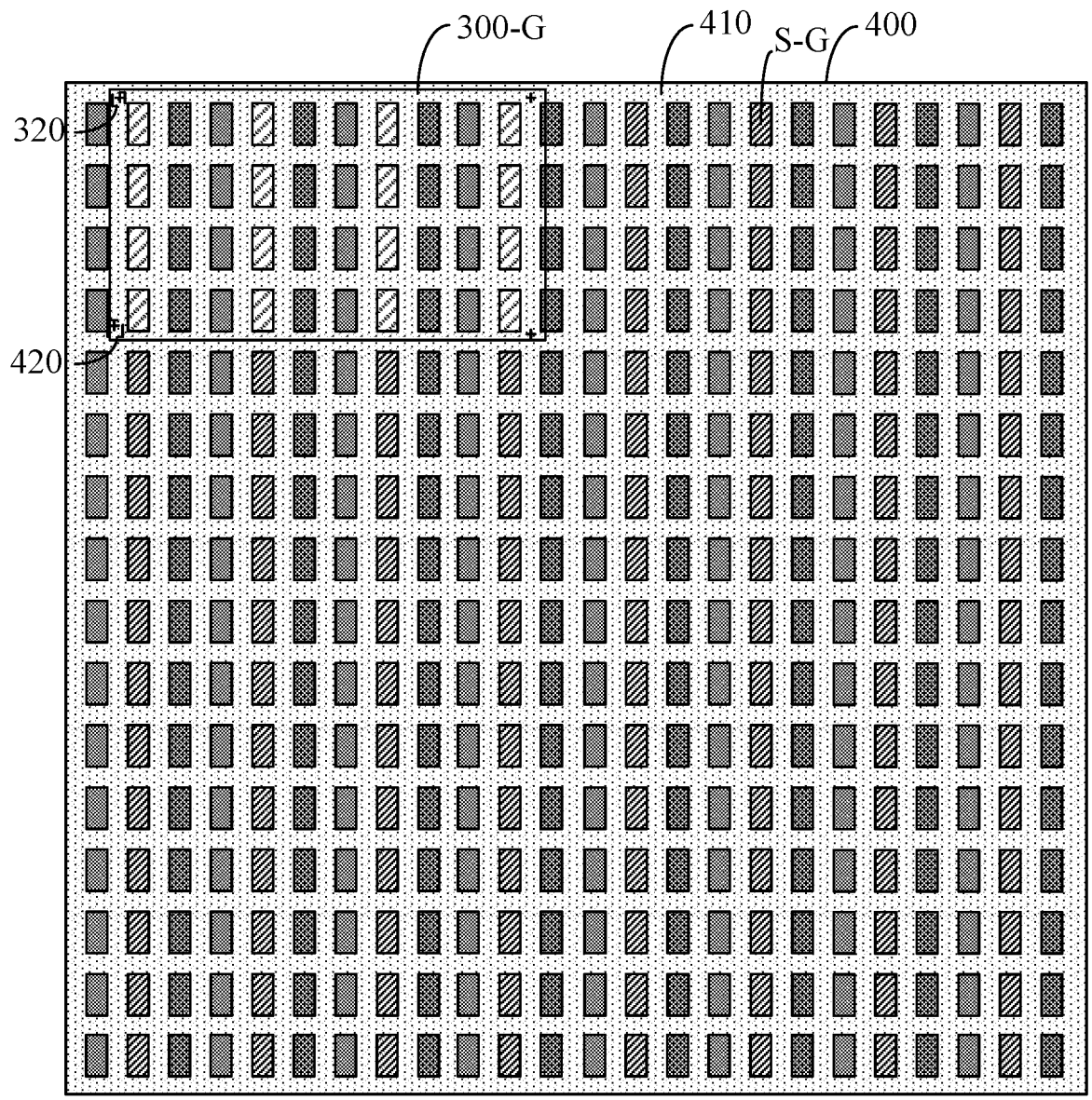
Figure 7G:
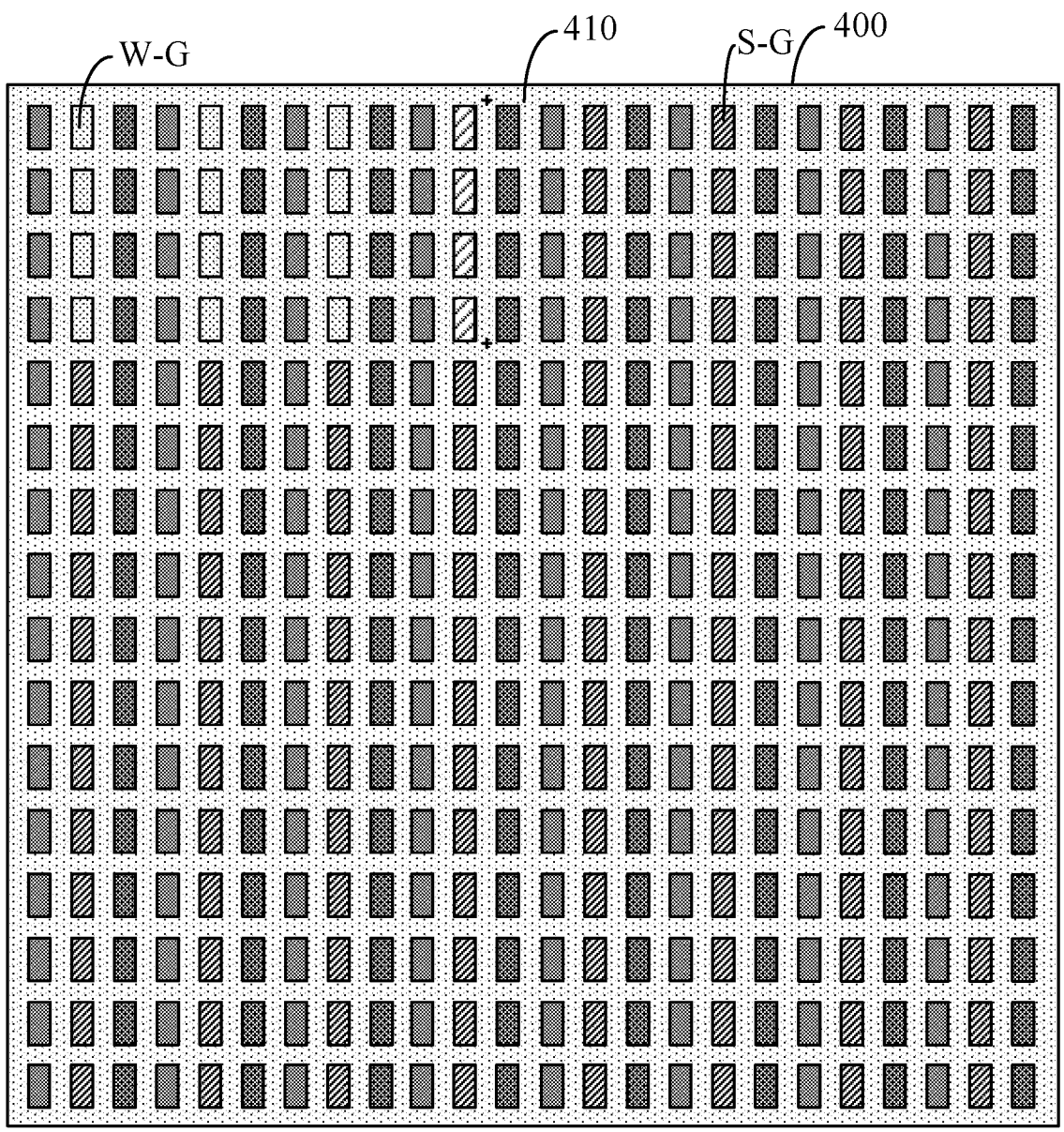

(9) Due to the adoption of a heat drying process, on one hand, the wafer 200-G can be separated from the to-be-picked-up green micro light emitting diodes W-G, and on the other hand, the bonding structures 310 can be more firmly bonded with the to-be-picked-up green micro light emitting diodes W-G. Therefore, the bonded green micro light emitting diodes W-R are picked up by the first medium load substrate 300-G, as shown in FIG. 7*e*. In FIG. 7*e*, a dotted line part on the wafer 200-G represents for the green micro light emitting diodes W-G which have been picked up by the first medium load substrate 300-G.

(10) The first medium load substrate 300-G is aligned with a second medium load substrate 400; as shown in FIG. 4, FIG. 5, FIG. 7*e* and FIG. 7*f*, the second medium load substrate 400 may be, for example, oblong and has the same size with a target substrate. In this way, four corners of the second medium load substrate 400 may be provided with second medium load alignment signs 420. Thus, the first medium load alignment signs 320 may be controlled to be aligned with the second medium load alignment signs 420, so that the green micro light emitting diodes W-G bonded on the first medium load substrate 300-G can be aligned with bonding film layers in micro light emitting diode regions S-G, corresponding to green, on the second medium load substrate 400 one to one. Then, the green micro light emitting diodes W-G bonded on the aligned first medium load substrate 300-G are bonded with the bonding film layers in the micro light emitting diode regions S-G, corresponding to green, on the second medium load substrate 400 one to one, so that the green micro light emitting diodes W-G are bonded with the bonding film layers 410.

(11) Due to the adoption of a hot pressing process, on one hand, the first medium load substrate 300-G can be separated from the picked up green micro light emitting diodes W-G, and on the other hand, the bonding film layers 410 can be more firmly bonded with the green micro light emitting diodes W-G. Therefore, the bonded green micro light emitting diodes W-G are picked up by the second medium load substrate 400. Furthermore, the green micro light emitting diodes W-G picked up by the first medium load substrate 300-G at the first time are transferred into the micro light emitting diode regions S-G, corresponding to green, on the second medium load substrate 400, as shown in FIG. 6*l* and FIG. 6*m*.

Then, the processes of the above-mentioned steps (8)-(11) are repeated, so that the green micro light emitting diodes W-G are respectively bonded in the micro light emitting diode regions S-G, corresponding to green, on the second medium load substrate 400, as shown in FIG. 6*l* and FIG. 6*m*.

Similarly, for blue, with reference to the processes of the above-mentioned steps (4)-(11), blue micro light emitting diodes W-B on a wafer 200-B are picked up by the bonding structures 310 on the third first medium load substrate 300-B corresponding to blue for many times, and the blue micro light emitting diodes W-B picked up every time are transferred into micro light emitting diode regions S-B, corresponding to blue, on the second medium load substrate 400, so that the micro light emitting diodes W-B are arranged on all the micro light emitting diode regions S-B, corresponding to blue, on the second medium load substrate 400, as shown in FIG. 6*l* and FIG. 6*m*.

It should be explained that the schematic diagram of the sectional structure of each step in the present embodiment may refer to the schematic diagram of the sectional structure in the above-mentioned embodiment, and the descriptions thereof are omitted herein.

Some yet further mass transfer methods for micro light emitting diodes, provided by an embodiment of the present disclosure, are modified with specific to the implementation ways in the above-mentioned embodiments. The differences between the present embodiment and the above-mentioned embodiments are only described below, and the similarities thereof are omitted herein.

During specific implementation, the target substrate may include at least two target regions with a same size. The size of one of the second medium load substrates is approximately the same as that of one of the target regions. Exemplarily, the target substrate may include two target regions with a same size. Or, the target substrate may include three target regions with a same size. Or, the target substrate may include four target regions with a same size. Of course, during actual application, the number of the target regions included in the target substrate may be designed and determined according to an actual application environment. In this way, the time of transferring the micro light emitting diodes from the second medium load substrate to the target substrate can also be shortened, it can be ensured that the performance of the anisotropic conductive adhesive is stable, and the stability of a display panel applying the target substrate can be improved.

During specific implementation, the target regions included in the target substrate may be arranged on the target substrate in an array. Or, the target regions included in the target substrate may be arranged on the target substrate in a first direction F1. Or, the target regions included in the target substrate may be arranged on the target substrate in a second direction F2.

Figure 8:
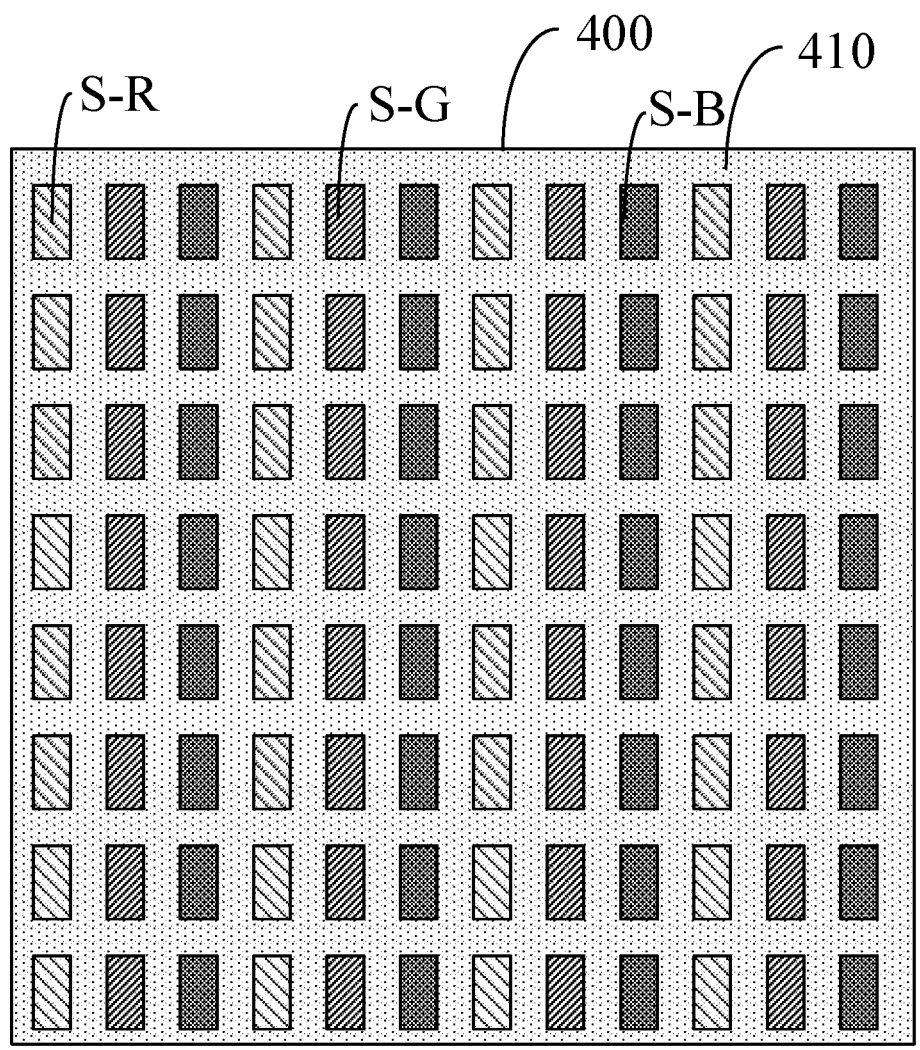
FIG. 8 is a schematic diagram of a top-view structure of some another second medium load substrates provided by embodiments of the present disclosure.

Exemplarily, during specific implementation, as shown in FIG. 2a and FIG. 8, the target substrate 100 may include four target regions Y1, Y2, Y3 and Y4 with the same sizes, and the size of the second medium load substrate 400 is approximately the same as that of the target region Y1.

During specific implementation, in the embodiment of the present disclosure, the second medium load substrate 400 may further include a bonding film layer 410 covering the second medium load substrate. The bonding film layer 410 is provided with micro light emitting diode regions corresponding to different colors. Moreover, one of the micro light emitting diode regions corresponds to one of the sub-pixels on the target substrate 100. Exemplarily, the bonding film layer 410 is provided with micro light emitting diode regions S-R corresponding to red, micro light emitting diode regions S-G corresponding to green and micro light emitting diode regions S-B corresponding to blue, wherein the micro light emitting diode regions S-R correspond to the red sub-pixels SPX-R on the target substrate 100, the micro light emitting diode regions S-G correspond to the green sub-pixels SPX-G on the target substrate 100, and the micro light emitting diode regions S-B correspond to the blue sub-pixels SPX-B on the target substrate 100.

During specific implementation, the step of transferring the micro light emitting diodes on the second medium load substrate into the corresponding sub-pixels on the target substrate at one time may include:

sequentially aligning the second medium load substrate with the target regions, and separating the second medium load substrate from the micro light emitting diodes after each alignment so that the micro light emitting diodes on the second medium load substrate are transferred into the corresponding sub-pixels on the target substrate at one time.

The processes of the mass transfer methods are listed below with embodiments, but it should be known that the specific processes are not limited herein.

The mass transfer methods provided by the embodiments of the present disclosure are mainly modified with specific to the implementation ways of the above-mentioned steps (8)-(9). The detailed descriptions of the above-mentioned steps (8)-(9) are mainly shown as below, and the rest same steps are omitted herein. The second medium load substrate 400 as shown in FIG. 9a can be obtained through embodiments corresponding to FIG. 6a to FIG. 6l or embodiments corresponding to FIG. 7a to FIG. 7g, on the second medium load substrate 400, red micro light emitting diodes W-R are respectively bonded in all micro light emitting diode regions S-R corresponding to red, green micro light emitting diodes W-G are arranged in all micro light emitting diode regions S-G corresponding to green, and blue micro light emitting diodes W-B are arranged in all micro light emitting diode regions S-B corresponding to blue.

(8) The second medium load substrate 400 is aligned with the target region Y1 in the target substrate 100, so that the red micro light emitting diodes W-R bonded on the second medium load substrate 400 can be aligned with the red sub-pixels SPX-R in the target region Y1 one to one, the green micro light emitting diodes W-G bonded on the second medium load substrate 400 can be aligned with the green sub-pixels SPX-G in the target region Y1 one to one, and the blue micro light emitting diodes W-B bonded on the second medium load substrate 400 can be aligned with the blue sub-pixels SPX-B in the target region Y1 one to one.

Figure 9A:
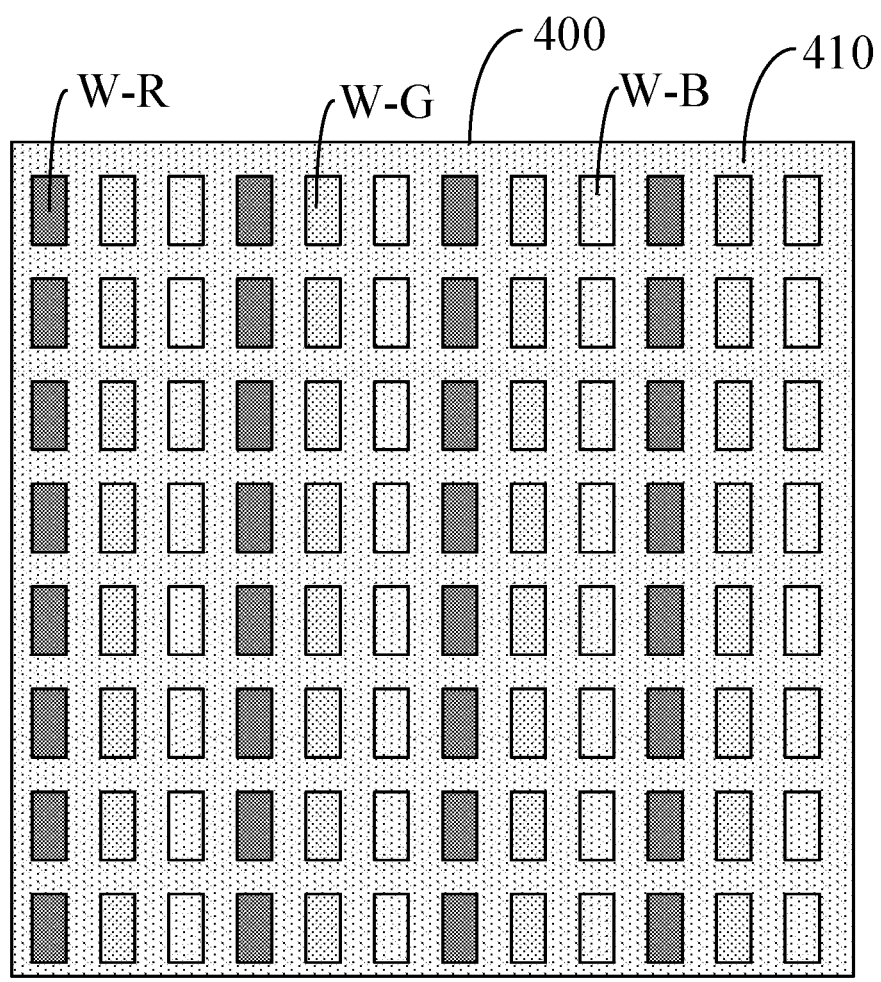
FIG. 9a and FIG. 9b are respectively schematic structural diagrams of all steps of some further mass transfer methods provided by embodiments of the present disclosure.
Figure 9B:
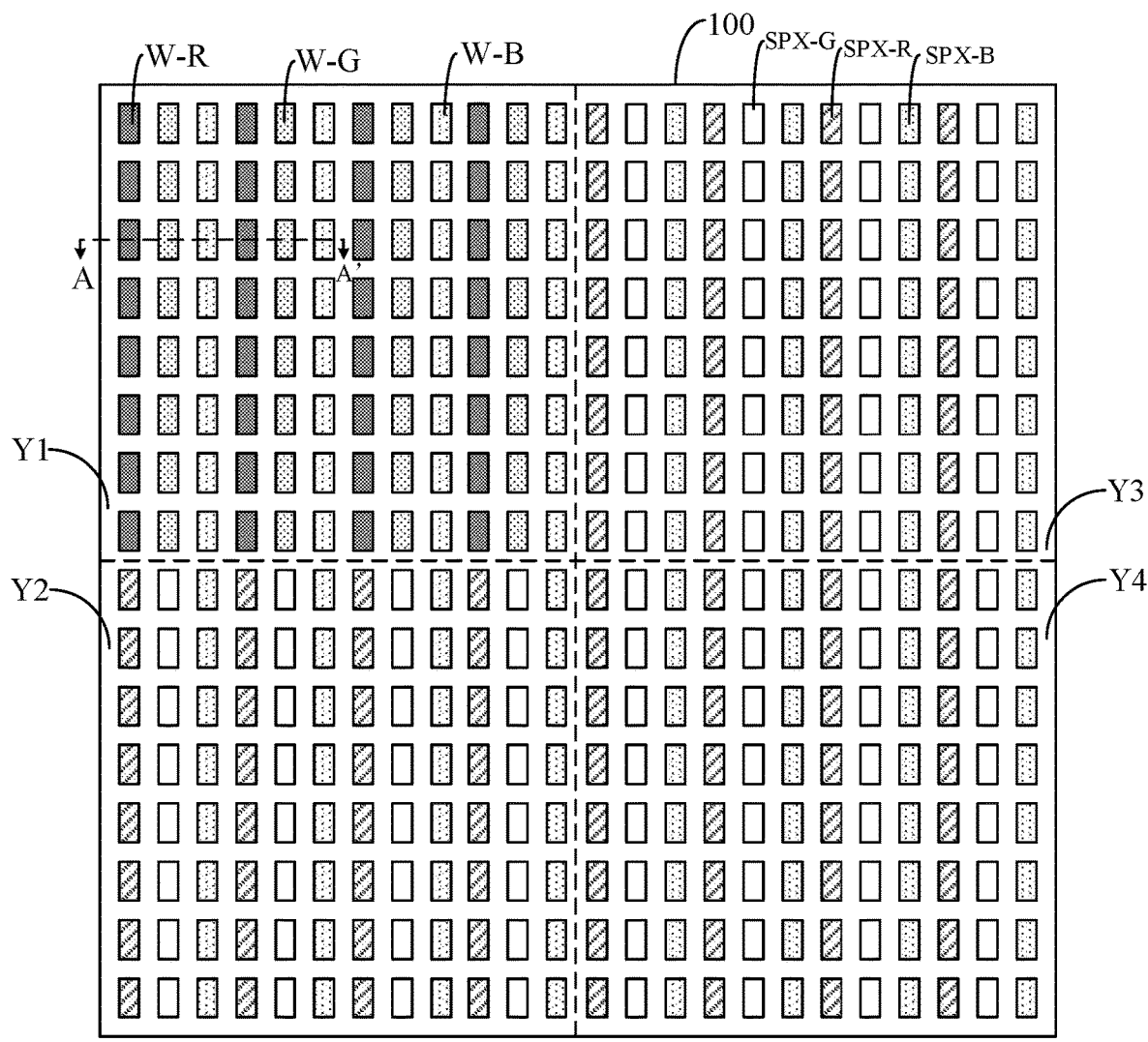

(9) As shown in FIG. 9b and FIG. 6o, due to the irradiation of laser on the second medium load substrate, a photolytic adhesive loses adhesion, so that the second medium load substrate is separated from the micro light emitting diodes on the second medium load substrate. Then, due to the adoption of a heat drying process, the micro light emitting diodes on the second medium load substrate are transferred into the corresponding sub-pixels in the target region Y1 at one time, and due to the action of a pressure, the electrodes of the micro light emitting diodes are electrically connected to anisotropic conductive adhesives in the corresponding sub-pixels. FIG. 9b is a schematic diagram of a top-view structure, and FIG. 6o is a schematic diagram of a sectional structure in FIG. 9b in the AA' direction.

(10) Then, the second medium load substrate 400 as shown in FIG. 9a can be obtained through embodiments corresponding to FIG. 6a to FIG. 6l or embodiments corresponding to FIG. 7a to FIG. 7g, on the second medium load substrate, red micro light emitting diodes W-R are respectively bonded in all micro light emitting diode regions S-R corresponding to red, green micro light emitting diodes W-G are arranged in all micro light emitting diode regions S-G corresponding to green, and blue micro light emitting diodes W-B are arranged in all micro light emitting diode regions S-B corresponding to blue.

(11) The second medium load substrate 400 is aligned with the target region Y2 in the target substrate 100, so that the red micro light emitting diodes W-R bonded on the second medium load substrate 400 can be aligned with the red sub-pixels SPX-R in the target region Y2 one to one, the green micro light emitting diodes W-G bonded on the second medium load substrate 400 can be aligned with the green sub-pixels SPX-G in the target region Y2 one to one, and the blue micro light emitting diodes W-B bonded on the second medium load substrate 400 can be aligned with the blue sub-pixels SPX-B in the target region Y2 one to one.

(12) As shown in FIG. 9b and FIG. 6o, due to the irradiation of laser on the second medium load substrate, a photolytic adhesive loses adhesion, so that the second medium load substrate is separated from the micro light emitting diodes on the second medium load substrate. Then, due to the adoption of a heat drying process, the micro light emitting diodes on the second medium load substrate are transferred into the corresponding sub-pixels in the target region Y2 at one time, and due to the action of a pressure, the electrodes of the micro light emitting diodes are electrically connected to anisotropic conductive adhesives in the corresponding sub-pixels.

Then, steps (10)-(12) in the present embodiment are repeated, so that the micro light emitting diodes on the second medium load substrate are transferred into the corresponding sub-pixels in the target region Y3 at one time, and due to the action of a pressure, the electrodes of the micro light emitting diodes are electrically connected to anisotropic conductive adhesives in the corresponding sub-pixels.

Then, steps (10)-(12) in the present embodiment are repeated, so that the micro light emitting diodes on the second medium load substrate are transferred into the corresponding sub-pixels in the target region Y4 at one time, and due to the action of a pressure, the electrodes of the micro light emitting diodes are electrically connected to anisotropic conductive adhesives in the corresponding sub-pixels.

It should be explained that the schematic diagram of the sectional structure of each step in the present embodiment may refer to the schematic diagram of the sectional structure in the above-mentioned embodiment, and the descriptions thereof are omitted herein.

Based on the same inventive concept, an embodiment of the present disclosure further provides a mass transfer system for micro light emitting diodes, as shown in FIG. 4, FIG. 5 and FIG. 8, the mass transfer system may include:

a first medium load substrate 300, provided with a plurality of bonding structures 310 and configured to pick up micro light emitting diodes on a component substrate at least once by the plurality of bonding structures 310 and transfer micro light emitting diodes picked up every time to a second medium load substrate 400; and the second medium load substrate 400, configured to transfer the micro light emitting diodes on the second medium load substrate 400 into corresponding sub-pixels on a target substrate at one time, wherein one of the micro light emitting diodes on the second medium load substrate corresponds to one of the sub-pixels on the target substrate.

During specific implementation, the number of the micro light emitting diodes borne on the second medium load substrate is greater than that of the micro light emitting diodes borne on the first medium load substrate.

During specific implementation, the size of the second medium load substrate may be not smaller than that of the target substrate. Exemplarily, the size of the second medium load substrate 400 may be greater than that of the target substrate 100. Or, as shown in FIG. 2a and FIG. 5, the size of the second medium load substrate 400 may also be approximately equal to that of the target substrate 100. It should be explained that some deviations may also be caused in an actual process due to restricts of process conditions or influences from other factors, and therefore, equal or same in the embodiment of the present disclosure refers to equal or same conforming to an error allowable range, or the deviations approximately conforming to the above-mentioned conditions fall within the protective scope of the present disclosure.

During specific implementation, the target substrate may further include at least two target regions with the same sizes; and the size of one of the second medium load substrates is approximately the same as that of one of the target regions. Exemplarily, during specific implementation, as shown in FIG. 2a and FIG. 8, the target substrate 100 may include four target regions Y1, Y2, Y3 and Y4 with the same sizes, and the size of the second medium load substrate 400 is approximately the same as that of the target region Y1.

It should be explained that the working process and detailed description of the mass transfer system are the same as those of the mass transfer methods in the above-mentioned embodiments, and therefore, the working process of the mass transfer system may be implemented with reference to the detailed description of the mass transfer methods in the above-mentioned embodiments, and the descriptions thereof are omitted herein.

According to the mass transfer method and system for the micro light emitting diodes, provided by the embodiment of the present disclosure, the plurality of bonding structures are arranged on the first medium load substrate, the micro light emitting diodes on the component substrate are picked up by these bonding structures independent from each other and are transferred to the second medium load substrate after being picked up, in this way, the micro light emitting diodes on the component substrate can be selectively transferred to the second medium load substrate, so that the efficiency is increased. Moreover, the bonding structures may also be repeatedly utilized, and the micro light emitting diodes are picked up at least once by the bonding structures on the first medium load substrate, so that the micro light emitting diodes on the component substrate are transferred to the second medium load substrate by repeatedly utilizing the bonding structures, and furthermore, the number of the used first medium load substrates and the cost can be reduced. In addition, the micro light emitting diodes on the second medium load substrate are transferred into the corresponding sub-pixels on the target substrate at one time without additional repeated transfer, so that the efficiency can be increased.

Although the preferred embodiments of the present disclosure has been described, additional changes and modifications on these embodiments can be made by the skilled in the art once they know the basic creative concept. Therefore, the appended claims are intended to be explained to include the preferred embodiments and all the changes and modifications falling within the scope of the present disclosure.

Obviously, the skilled in the art can make various alterations and variations on the embodiments of the present disclosure without departing from the spirit and scope of the present disclosure. In this way, if these alterations and variations of the embodiments of the present disclosure fall within the scopes of the claims and the equivalent technologies of the present disclosure, the present disclosure is also intended to include the alterations and variations.

What is claimed is:

1. A mass transfer method for micro light emitting diodes, the mass transfer method comprising:
   providing a component substrate on which a plurality of micro light emitting diodes are formed;
   picking up the micro light emitting diodes on the component substrate at least once by a plurality of bonding structures on a first medium load substrate, and transferring micro light emitting diodes picked up every time to a second medium load substrate; wherein one of the micro light emitting diodes on the second medium load substrate corresponds to one of sub-pixel on a target substrate; and
   transferring the micro light emitting diodes on the second medium load substrate into corresponding sub-pixels on the target substrate at one time;
   wherein the plurality of bonding structures are discrete, and one of the bonding structures corresponds to one of the sub-pixels on the target substrate; and
   wherein a plurality of bonding structures of the first medium load substrate are formed by following steps:
   forming a bonding material layer on the first medium load substrate; and
   patterning the bonding material layer by adopting a one-time patterning process to form the plurality of bonding structures arranged in an array.

2. The mass transfer method according to claim 1, wherein a plurality of bonding structures of the first medium load substrate are formed by following steps:
   forming a bonding material layer on a first medium load substrate motherboard;
   patterning the bonding material layer by adopting a one-time patterning process to form the plurality of bonding structures arranged in an array; and
   cutting the first medium load substrate motherboard on which the bonding structures are formed to obtain the first medium load substrate on which the plurality of bonding structures arranged in an array are formed.

3. The mass transfer method according to claim 1, wherein quantity of the micro light emitting diodes borne on the second medium load substrate is greater than quantity of the micro light emitting diodes borne on the first medium load substrate.

4. The mass transfer method according to claim 1, wherein the plurality of micro light emitting diodes comprise micro light emitting diodes with at least one color; one first medium load substrate is provided; and the picking up the micro light emitting diodes on the component substrate at least once by the plurality of bonding structures on the first medium load substrate, and transferring micro light emitting diodes picked up every time to the second medium load substrate comprises:

successively for micro light emitting diodes with each color of the plurality of micro light emitting diodes, picking up the micro light emitting diodes with the each color on the component substrate for many times by the first medium load substrate, and transferring the micro light emitting diodes with the each color picked up every time into micro light emitting diode regions, corresponding to the each color, on the second medium load substrate.

5. The mass transfer method according to claim 4, wherein the picking up the micro light emitting diodes with the each color on the component substrate comprises:

aligning the first medium load substrate with the component substrate;

bonding the bonding structures on the aligned first medium load substrate with to-be-picked-up micro light emitting diodes with the each color on the component substrate one to one; and separating the component substrate from the to-be-picked-up micro light emitting diodes with the each color by adopting a laser or heating drying process so that the to-be-picked-up micro light emitting diodes with the each color bonded with the first medium load substrate are picked up.

6. The mass transfer method according to claim 4, wherein the second medium load substrate comprises a bonding film layer covering the second medium load substrate; and the transferring the micro light emitting diodes with the each color picked up every time into the micro light emitting diode regions, corresponding to the each color, on the second medium load substrate comprises:

aligning the first medium load substrate with the second medium load substrate;

bonding the micro light emitting diodes with the each color on the aligned first medium load substrate with the micro light emitting diode regions, corresponding to the each color, on the second medium load substrate one to one; and separating the first medium load substrate from the micro light emitting diodes with the each color on the first medium load substrate so that the micro light emitting diodes with the each color on the first medium load substrate are transferred into the micro light emitting diode regions, corresponding to the each color, on the second medium load substrate.

7. The mass transfer method according to claim 6, wherein material of the bonding structures comprises a pyrolytic adhesive; and the separating the first medium load substrate from the micro light emitting diodes with the each color on the first medium load substrate comprises:

separating the first medium load substrate from the micro light emitting diodes with the each color on the first medium load substrate by adopting a hot pressing process.

8. The mass transfer method according to claim 6, wherein material of the bonding structures comprises a photolytic adhesive; and the separating the first medium load substrate from the micro light emitting diodes with the each color on the first medium load substrate comprises:

separating the first medium load substrate from the micro light emitting diodes with the each color on the first medium load substrate by virtue of laser.

9. The mass transfer method according to claim 1, wherein the target substrate comprises at least two target regions with a same size; size of one of the second medium load substrates is substantially same as that of one of the target regions; and the transferring the micro light emitting diodes on the second medium load substrate into the corresponding sub-pixels on the target substrate at one time comprises:

aligning the second medium load substrate with the target regions sequentially, and separating the second medium load substrate from the micro light emitting diodes after each alignment so that the micro light emitting diodes on the second medium load substrate are transferred into the corresponding sub-pixels on the target substrate at one time.

10. The mass transfer method according to claim 9, wherein material of the bonding film layer on the second medium load substrate comprises a pyrolytic adhesive; and the separating the second medium load substrate from the micro light emitting diodes comprises:

separating the second medium load substrate from the micro light emitting diodes on the second medium load substrate by adopting a hot pressing process; or wherein material of the bonding film layer on the second medium load substrate comprises a photolytic adhesive; and the separating the second medium load substrate from the micro light emitting diodes comprises:

separating the second medium load substrate from the micro light emitting diodes on the second medium load substrate by virtue of laser.

11. The mass transfer method according to claim 10, wherein the target substrate comprises a plurality of sub-pixels, each of the sub-pixels comprises a first electrode, a second electrode, and anisotropic conductive adhesives respectively located on sides of the first electrode and the second electrode facing away from the target substrate, wherein the first electrode and the second electrode are formed in advance;

while or after separating the second medium load substrate from the micro light emitting diodes on the second medium load substrate, the mass transfer method further comprises:

connecting electrodes of the micro light emitting diodes separated from the second medium load substrate electrically to the anisotropic conductive adhesives in the corresponding sub-pixels.

12. The mass transfer method according to claim 1, wherein the plurality of micro light emitting diodes comprise micro light emitting diodes with at least one color; one color corresponds to one of the first medium load substrates; and the picking up the micro light emitting diodes on the component substrate at least once by the plurality of bonding structures on the first medium load substrate, and transferring micro light emitting diodes picked up every time to the second medium load substrate comprises:

for micro light emitting diodes with each color of the plurality of micro light emitting diodes, picking up the micro light emitting diodes with the each color on the component substrate for many times by the first medium load substrate corresponding to the each color, and transferring the micro light emitting diodes with the each color picked up every time into micro light emitting diode regions, corresponding to the each color, on the second medium load substrate.

13. The mass transfer method according to claim 1, wherein size of the second medium load substrate is greater than or equal to that of the target substrate; and the transferring the micro light emitting diodes on the second medium load substrate into the corresponding sub-pixels on the target substrate at one time comprises:

aligning the second medium load substrate with the target substrate; and separating the second medium load substrate from the micro light emitting diodes so that the micro light emitting diodes on the second medium load substrate are transferred into the corresponding sub-pixels on the target substrate at one time.

14. A mass transfer system for micro light emitting diodes, the mass transfer system comprising:

a first medium load substrate, at least one of which is provided with a plurality of bonding structures, and a second medium load substrate;

wherein the first medium load substrate is configured to pick up micro light emitting diodes on a component substrate at least once by virtue of the plurality of bonding structures and transfer micro light emitting diodes picked up every time to the second medium load substrate; wherein the plurality of bonding structures are discrete, and one of the bonding structures corresponds to one of the sub-pixels on the target substrate;

wherein the second medium load substrate is configured to transfer the micro light emitting diodes on the second medium load substrate into corresponding sub-pixels on a target substrate at one time, and one of the micro light emitting diodes on the second medium load substrate corresponds to one of the sub-pixels on the target substrate; and wherein the plurality of bonding structures of the first medium load substrate are arranged in an array and formed by patterning bonding material layer on the first medium load substrate by adopting a one-time patterning process.

15. The mass transfer system according to claim 14, wherein quantity of the micro light emitting diodes borne on the second medium load substrate is greater than quantity of the micro light emitting diodes borne on the first medium load substrate.

16. The mass transfer system according to claim 14, wherein a size of the second medium load substrate is greater than or equal to that of the target substrate.

17. The mass transfer system according to claim 14, wherein the target substrate comprises at least two target regions with a same size; and a size of one of the second medium load substrates is substantially same as that of one of the target regions.

* * * * *